US005182253A

United States Patent [19]

Kishi et al.

[11] Patent Number: 5,182,253

[45] Date of Patent: Jan. 26, 1993

[54] PURIFICATION APPARATUS FOR SUPERCONDUCTOR FINE PARTICLES

[75] Inventors: Fumio Kishi; Masatake Akaike; Keisuke Yamamoto, all of Atsugi; Taiko Motoi, Sagamihara; Norio Kaneko, Atsugi; Fujio Iwatate, Tokyo; Kazuaki Ohmi, Hadano; Takehiko Kawasaki, Atsugi; Atsuko Shinjou, Isehara, all of Japan

[73] Assignee: Canon Kabushiki Kaisha, Tokyo, Japan

[21] Appl. No.: 767,840

[22] Filed: Sep. 30, 1991

Related U.S. Application Data

[63] Continuation of Ser. No. 624,523, Dec. 10, 1990, abandoned, which is a continuation of Ser. No. 216,864, Jul. 7, 1988, abandoned.

[30] Foreign Application Priority Data

| | | | |
|---|---|---|---|
| Dec. 9, 1987 | [JP] | Japan | 62-309473 |
| Mar. 29, 1988 | [JP] | Japan | 63-073363 |
| Apr. 6, 1988 | [JP] | Japan | 63-083025 |
| Apr. 6, 1988 | [JP] | Japan | 63-083026 |

[51] Int. Cl.[5] .......... H01L 39/24; B03B 1/00; B03C 1/02

[52] U.S. Cl. .......... 505/1; 209/2; 209/11; 209/39; 209/212; 505/727; 505/932

[58] Field of Search .......... 209/2, 11, 212, 1, 3, 209/39, 40, 478; 505/1, 931, 932, 933, 725, 726, 727

[56] References Cited

U.S. PATENT DOCUMENTS

| | | | |
|---|---|---|---|
| 4,828,685 | 5/1989 | Stephens | 209/11 |
| 5,047,387 | 9/1991 | Talmy et al. | 204/2 X |
| 5,049,540 | 9/1991 | Park et al. | 209/2 X |

FOREIGN PATENT DOCUMENTS

| | | |
|---|---|---|
| 47-45720 | 11/1972 | Japan . |
| 0698657 | 11/1979 | U.S.S.R. . |
| 0950442 | 8/1982 | U.S.S.R. . |
| WO8808619 | 11/1988 | World Int. Prop. O. . |

OTHER PUBLICATIONS

J. Phys. E: Sci. Instrum., vol. 20, (1987), Oct. 6, 1987, pp. 1292–1293, U. K. Vieira, et al.

Applied Physics Letters, vol. 51, No. 23, Dec. 7, 1987, pp. 1954–1956, NY, Barsoum, et al.

Patent Abstracts of Japan, vol. 13, No. 199, May 11, 1989, JP-A-1 22 359, Jan. 25, 1989.

Patent Abstracts of Japan, vol. 13, No. 211, May 17, 1989, JP-A-1 30 659, Feb. 1, 1989.

Patent Abstracts of Japan, vol. 13, No. 137, Apr. 5, 1989, JP-A-63 302, 966, Dec. 9. 1988.

Patent Abstracts of Japan, vol. 13, No. 187, May 2, 1989, JP-A-1 15, 158, Jan. 19, 1989.

*Primary Examiner*—Donald T. Hajec

*Attorney, Agent, or Firm*—Fitzpatrick, Cella, Harper & Scinto

[57] ABSTRACT

A purification apparatus for superconductor fine particles is provided which comprises a device for forming a flow of powder containing the superconductor fine particles, and device for applying a magnetic field to the flow of the powder.

48 Claims, 18 Drawing Sheets

PURIFICATION APPARATUS FOR SUPERCONDUCTOR FINE PARTICLES

CROSS-REFERENCE TO RELATED APPLICATIONS

This application is a continuation of U.S. Ser. No. 07/624,523, filed Dec. 10, 1990, now abandoned which is a continuation of U.S. Ser. No. 07/216,864, filed Jul. 7, 1988, now abandoned.

BACKGROUND OF THE INVENTION

1. Field of the Invention

The present invention relates to an apparatus for classifying and purifying fine particles to obtain only the desired superconductor particles form among a mixtures of fine particles of different particle diameters comprised of superconductors, normal conductors, insulators or the like having different critical temperatures, critical magnetic fields, etc.

2. Related Background Art

In recent years, it has been discovered that the sintering of ceramic materials with certain definite composition can give a sinter that exhibits superconductivity (or superconducting) at 77 K. or more, or, in some instances, near room temperature. However, the crystal structure and the phase of these superconductors have not been sufficiently elucidated yet, and usually there coexist non-superconducting crystal phases.

In the instance where the non-superconducting crystal phases coexist, it is very difficult to separate them from the superconducting crystal phases. Moreover, no technique has been established that will form only the superconducting crystalline material by controlling heat-treatment conditions. In recently available ceramic superconductors, there also often coexist a plurality of superconducting crystal phases different in the critical temperature or critical magnetic field, and no method has been established to separate only the superconducting crystal phases having any desired critical temperature range and critical magnetic field range from among them.

In addition, the sinter having superconductivity usually comprises amass or aggregate of fine crystals, and its superconductivity characteristics depend greatly on the state of crystal grain boundaries so that its crystal grain boundaries must be made uniform to obtain a sinter having stable characteristics.

A proposal has never been made to obtain a superconducting sinter having uniform crystal grain boundaries by re-sintering superconductor fine particles having uniform particle diameter. However, any suitable method for classifying such superconductor fine particles having uniform particle diameters has not been discovered, and nothing has been available except for the method in which the generally practiced particle classification methods as described in Funtai Kogaku Handobukku (Particle Technology Handbook) (edited by Koichi Iitani, Asakura Publishing Co.) are applied in the superconductor fine particles.

Known as the conventional generally practiced particle classification methods are a screening method in which sieves having different openings are piled up in the order from those having larger opening diameter to carry out classification, a sedimentation method in which the terminal settling velocity of the particles settling in a fluid is utilized to carry out the classification, and similar methods.

For example, however, in the screening method, it is impossible to prepare those having a screen opening of several micrometers or less, thus preventing classification for particles of very small diameter. Moreover, it is often practiced to apply pressure loading to the fine particles to force them to pass through the screen openings, and in such an instance the problems occur such that the classification cannot be carried out in vacuo as a means for classification with higher precision. Also, in the sedimentation method, where the settling velocity depends not only on the diameter of particles but also the specific gravity thereof, no strict classification can be carried out. In instances where a liquid phase sedimentation method is used, it requires a lot of labor to separate fine particles from liquid, and also the settling velocity is so low in general as to take much time for the classification. This method also involves the problems such that it cannot naturally be carried out in vacuo.

SUMMARY OF THE INVENTION

An object of the present invention is to provide an apparatus for purifying superconductor fine particles that is capable of separating and purifying only the superconductor fine particles from among powder to be purified containing superconductor fine particles.

Another object of the present invention is to provide an apparatus for purifying superconductor fine particles that is capable of classifying and purifying only the superconductor fine particles having desired characteristics from among powder to be purified in which a plurality of superconductor fine particles having different characteristics such as particle diameter, critical temperature and critical magnetic field coexist.

The above objects can be achieved by the invention described below.

According to an aspect of the present invention, there is provided a purification apparatus for superconductor fine particles, comprising a means for forming a flow of powder containing the superconductor fine particles, and a means for applying a magnetic field to the flow of said powder.

According to another aspect of the present invention, there is provided a purification apparatus for superconductor fine particles, comprising a means for blowing powder containing the superconductor fine particles in a horizontal direction by use of a carrier gas to form a flow of said powder, a partition means horizontally provided, having a plurality of slits at different distances from said blowing means, and a means provided beneath said respective slits, for applying a magnetic field to the flow of said powder.

According to still another aspect of the present invention, there is provided a purification apparatus for superconductor fine particles, comprising a means for floating powder containing the superconductor fine particles by use of a carrier gas to form a flow of said powder, a partition means vertically provided, having a plurality of slits at different heights from said floating means, and a means provided at the positions facing said respective slits for applying a magnetic field to the flow of said powder.

According to a further aspect of the present invention, there is provided a purification apparatus for superconductor fine particles, comprising a means for allowing powder containing the superconductor fine particles to fall, one or a plurality of partition means horizontally provided in a falling path of said powder and provided with a slit at a certain part thereof, and means for alternately applying with an appropriate period, magnetic fields having the magnetic inclinations in the two directions facing each other in the plane rectangular to the falling direction of said powder.

Still other embodiments of the present invention will become apparent from the following descriptions.

BRIEF DESCRIPTION OF THE DRAWINGS

FIG. 3 is a graph showing an X-ray diffraction pattern of a purified superconductor;

DETAILED DESCRIPTION OF THE PREFERRED EMBODIMENTS

Figure 1:
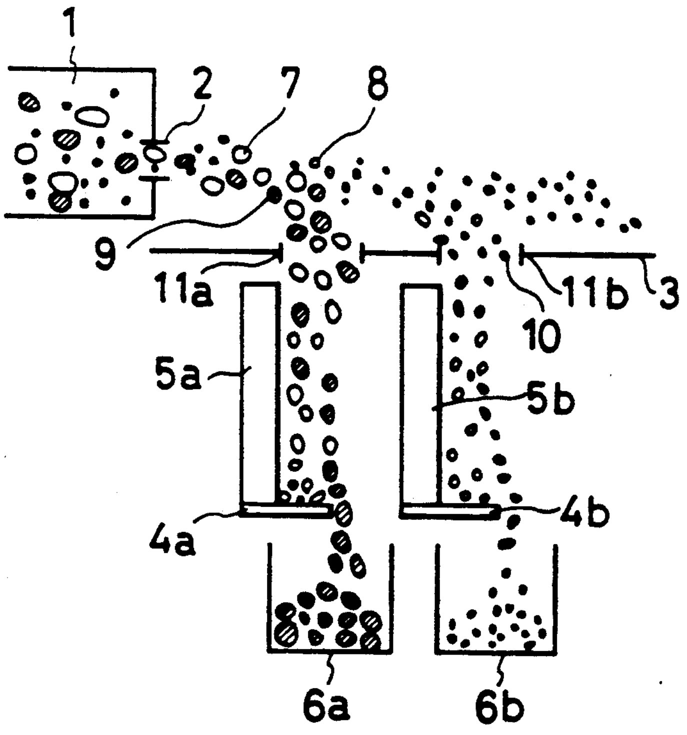
FIGS. 1, 3, 7, 12, 13, 14, 15, 16, 17, 20, 21, 22, 23, 26 and 27 each illustrate an example of the purification apparatus for superconductor fine particles according to the present invention.

The present invention is based on the utilization of the Meissner effect which is attributable to magnetic properties inherent in superconductors.

The Meissner effect is meant to be the effect that the superconductor fine particles become perfectly diamagnetic when a magnetic field is applied to the fine particles at the temperature at which the superconductor fine particles exhibit superconductivity. More specifically, at the above-mentioned temperature, application of a magnetic field by means of a magnet to the powder containing superconductor fine particles produces repulsion to the magnet owing to the Meissner effect with respect to those having a particle diameter of about 0.01 μm or more. On the other hand, no repulsion is produced since the Meissner effect is not brought about with respect to those having a particle diameter less than that and the fine particles of normal conductors or insulators.

According to this principle it is possible to separate and purify with a high precision only the superconductor fine particles from among the powder mixed with normal conductors or insulators.

For example, a flow of powder to be purified, mixed with normal conductors, insulators, etc. is formed, and a magnetic field with a strength by which the superconductivity can be effectively utilized is applied to the powder to be purified, under the temperature of the degree at which the superconductor fine particles in the powder to be purified exhibit the superconductivity, so that the repulsion produced as a result owing to the Meissner effect causes positional separation of the flow of the superconductor fine particles in the powder to be purified, from the flow of the particles other than the same, thus effecting the purification.

The locus of the flow of a superconductor containing fine particle that shifts accord to the Meissner effect depends on the proportion of the superconductor contained in the fine particle. This is because the force by which the superconductor fine particle is moved is produced by the Meissner effect. Namely, even if the superconductors have the same particle diameters, the repulsion becomes small when the proportion of the superconductors is small. In other words, the low purity thereof results in a small change in the locus of the flow of particles.

For example, in instances where a magnetic field having the distribution such that the magnetic flux density becomes smaller from a lower part toward an upper part is applied, the particles having a small proportion of superconductors may be subjected to a small Meissner effect, resulting in a small floating height. On the contrary, the particles having a large proportion of superconductors can float higher. The floating height depends on the balance between the weight of particles and the greatness of the Meissner effect.

By selectively collecting portions at a certain height of the thus floated superconductor fine particles, it is possible to take out only the superconductor fine particles having desired purity, i.e., desired values for the proportion of superconductors.

Here may be used any means for forming the flow of powder in the apparatus of the present invention, including, for example, a means for directly blowing a carrier gas to the powder, and a means for naturally allowing the powder to fall in a fluid such as helium gas and liquid nitrogen.

The carrier gas used in the apparatus of the present invention may include, for example, helium gas. Also preferred is a gas that may not liquify even at temperatures sufficiently lower than the critical temperature of the superconductors.

The means for applying a magnetic field to the flow of the above powder include, for example, a permanent magnet and an electromagnet, which magnets may have any shape so long as there can be applied a magnetic field by which the superconductor fine particles can deflect their flying path. Accordingly, it may include plate-shaped, column-shaped or concave-shaped magnets, or those arranged with a plurality of these magnets. In instances where the flow of powder is formed by gravitational fall, the magnets may be shaped or positioned such that a magnetic field that deflects their falling orbital path can be applied.

In instances where a desired particle diameter or particle size distribution is to be obtained, various types of classifying means can also be used i combination according to the range of the desired particle diameter. However, since the Meissner effect for the effective purification can be obtained usually in respect of the superconductor fine particles having a particle diameter of 0.01 μm or more, the fine particles having a particle diameter of 0.01 μm or more and the fine particles having a smaller particle diameter can be readily classified, and such has never been classified easily by conventional classification methods.

It is also possible to carry out classification of particles with different particle diameters. More specifically, if powder having uniform specific gravity is treated in the apparatus of the present invention, the difference in flying distance or floating height of the particles owing to the carrier gas or the difference in terminal settling velocity, for example, depends on their particle diameter. Therefore, they may be collected selectively by zones, so that it also becomes possible to classify the superconductor fine particles included in a desired particle diameter range from among the superconductor fine particles having a particle diameter of 0.01 μm or more.

Superconductor fine particles having the same weight and different specific gravity, which have differences in their settling velocity, can also be separated according to the specific gravity by sedimentation in a liquid.

To carry out the powder classification with higher precision in the apparatus of the present invention, a partition means having one or a plurality of slits may preferably be provided additionally in the same apparatus.

In the apparatus of the present invention, superconductor fine particles having a desired critical temperature range or critical magnetic field range can also be obtained from among powders in which a plurality of superconductor fine particles are different in the critical temperature (superconductive transition temperature) or critical magnetic field (superconductive transition magnetic field).

For example, in instances where the superconductor fine particles having a desired critical temperature range are to be obtained in the above purification apparatus, the above purification apparatus may be operated while appropriately selecting the temperatures of a powder storing vessel, a carrier gas, a powder flow path, etc. according to the desired critical temperature range.

Also in instances where the superconductor fine particles having a desired critical magnetic field range are to be obtained, the above purification apparatus may be operated while appropriately selecting the magnetic field applied to the powder to be purified, according to the desired critical magnetic field range.

In the apparatus of the present invention, it is further possible to obtain only the powder having a desired specific gravity, not to speak of the above purification and classification of the superconductor fine particles.

More specifically, if the powder has a uniform particle diameter, the difference in flying distance or floating height of the powder owing to the carrier gas, the difference in terminal settling velocity, and the degree of changes in the flow direction of superconductor fine particles owing to the application of a magnetic field depends on its specific gravity. Therefore it may be selectively collected by zones, so that it also becomes possible to separate only the superconductor fine particles having a desired specific gravity.

The above purification apparatus for superconductor fine particles of the present invention will be described below by giving several preferred embodiments.

A first embodiment of the apparatus of the present invention is characterized by having a means for horizontally ejecting powder containing superconductor fine particles to form a flow of the powder, a partition means horizontally provided, having one or a plurality of slits at the position with a specified distance from an ejecting outlet, and means provided beneath said respective slits, for applying a magnetic field in the vertical direction to the flow of said powder.

According to the present embodiment, the powder to be purified containing superconductor fine particles maintained to a temperature at which their superconductivity can be sufficiently exhibited is horizontally ejected from a nozzle or the like together with a carrier gas, whereupon the powder particles larger in particle diameter and heavier among the powder to be purified begin to fall at a position near to the above nozzle, and the particle smaller in particle diameter and lighter among them being to all at a position farther from the above nozzle, so that the groups of the falling powder particles form the particle size distribution in the horizontal direction. Classification can be carried out by selectively separating them by the partition means horizontally provided, having one or a plurality of slits at the position with an appropriate distance from the nozzle. Here, the various condition such as the kind of the above-mentioned carrier gas, the flow rate, the flow quantity, and the slit width may be appropriately selected according to the desired particle diameter range.

Only the superconductor fine particles can also be separated by providing a plate-shaped magnet beneath the above slit, having a width and shape sufficient for making purification under the above temperature, in a vertical state or a state slightly inclined with the vertical, applying the magnetic field to the powder to be purified (that has already been classified and passed through the slit as described above to let the powder fall in the vicinity of the plate-shaped magnet, under the temperature previously mentioned), to change the falling locus of the superconductor fine particle sin the powder to be purified, and collecting them by use of a collecting means each provided at the falling position of the superconductor fine particles and at the falling position of the other fine particles. Thus, the apparatus of the present embodiment can carry out the purification and classification simultaneously.

In the above apparatus, the means for applying a magnetic field may be any of a permanent magnet and an electromagnet, without any particular limitation in its shape. However, when, for example, a sheet of the above plate-like magnet is made of a plurality of electromagnets to give means for applying magnetic fields that can repeat on-off in succession in the powder-falling direction and with a specified period, the falling locus of the superconductor fine particles can be changed with good efficiency to bring about the advantages such that the purification process can be simplified. To attempt to further simplify this purification process, a plate of non-magnetic material may be provided on the surface of the magnet and may be vibrated (as exemplified by an ultrasonic vibration plate), thus making it possible to smooth the flow of powder.

A second embodiment of the apparatus of the present invention is characterized by a means for floating the powder containing superconductor fine particles, in a carrier-gas flow path, means for applying a magnetic field that may move the superconductor fine particles in the vertical direction to the carrier gas flow formed by the first-mentioned means, and a partition means vertically provided, having one or a plurality of the slits at the position facing said magnetic field applying mean.

According to the present embodiment, the powder containing superconductor fine particles ar floated by the floating means using a carrier gas, so that, if the powder has a uniform particle diameter, the powder having a smaller specific gravity will float higher and the powder having a larger specific gravity will not float as high. Accordingly, the purification and separation can be simultaneously carried out by applying a magnetic field to the floating powder, separating selectively to the outside of the carrier gas flow only the superconductor fine particles from among the powder by the repulsion owing to the Meissner effect, through means of a partition panel provided with one or a plurality of slits and according to the height of the slits, and collecting the particles using a collecting means provided at the outside of the carrier gas flow.

Here, the floating means may be any means so long as it is a means capable of blowing the powder by use of the carrier gas, and may include, for example, a means for directly blowing the carrier gas to the powder, means for putting the powder in a container and introducing the carrier gas in that container, means for allowing the powder to fall from a container and blowing the carrier gas to that falling powder, and means for creating a suction force from the direction of the magnetic field applying means.

The magnetic field applying means may also be any of a permanent magnet and an electromagnet also in the present embodiment, without any particular limitation in its shape. When the magnet comprises, for example, an electromagnet for applying a magnetic field that can repeat on-off synchronously with the powder floating means and with a specified period, the classification can be carried out more precisely.

Figure 28:
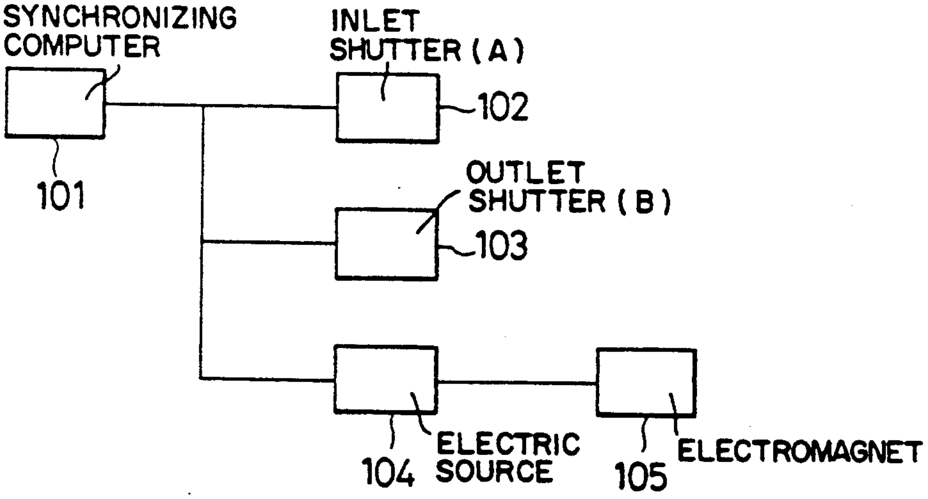
FIGS. 28 and 29 respectively illustrate a block diagram and a time chart of a controlling system in the apparatus of the present invention.

In this instance, the respective sections can be synchronized by electrical control with use of a controlling system as shown in FIG. 28. In FIG. 28, the numeral 101 denotes a synchronizing computer; 102, a shutter to open and close an inlet (Position A exemplified in FIG. 14 and FIG. 15 of the apparatus of an Example described later) for injecting a carrier gas for blowing up the powder; 103, a shutter fitted to an inlet (Position B exemplified in FIG. 14 and FIG. 15 of the apparatus of an Example described later) for introducing the superconductor fine particles discharged from the carrier-gas flow path by the repulsion owing to the Meissner effect from among the given floated fine particles; 104, an electric source for the magnet; 105, the electromagnet (which is provided at Position M exemplified in FIG. 14 and FIG. 15 of the apparatus of an Example described later) that produces the magnetic field necessary for purifying the superconductor fine particles owing to the Meissner effect.

Figure 29:
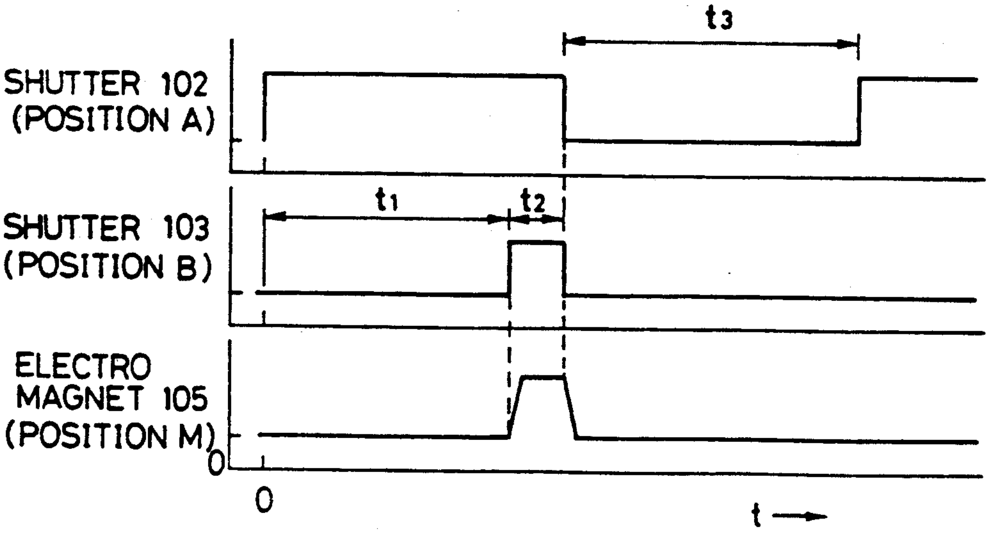

The above shutters and magnet are driven by being synchronized as shown in FIG. 29. In FIG. 29, the abscissa indicate the time, and the ordinate indicate the driving pulse in respect of the actuation of the shutters 102 and 103, and the electric current to be flowed in respect of the magnet 105. The shutters 102 and 103 turn "open" by the rise of the pulse and turn "close" by the decay of the pulse.

First, the shutter 102 turns "open" to bring the powder particles to float in the carrier-gas flow path together with the carrier gas. The shutter 103 turns "open" when the time $t_1$ lapses and the floating positions have been settled for each particle diameter, and at the same time the magnet turns "on". Thereafter, during the time $t_2$, the superconductor fine particles are discharged from the carrier-gas flow path through the introducing inlet. Thereafter the shutters 102 and 103 turn "close" and the magnet turns "off". After the time $t_3$ lapsed and the non-superconductor particles having remained in the carrier-gas flow path have fallen, the shutter 102 again turns "open", thus repeating the above operations.

Figure 15:
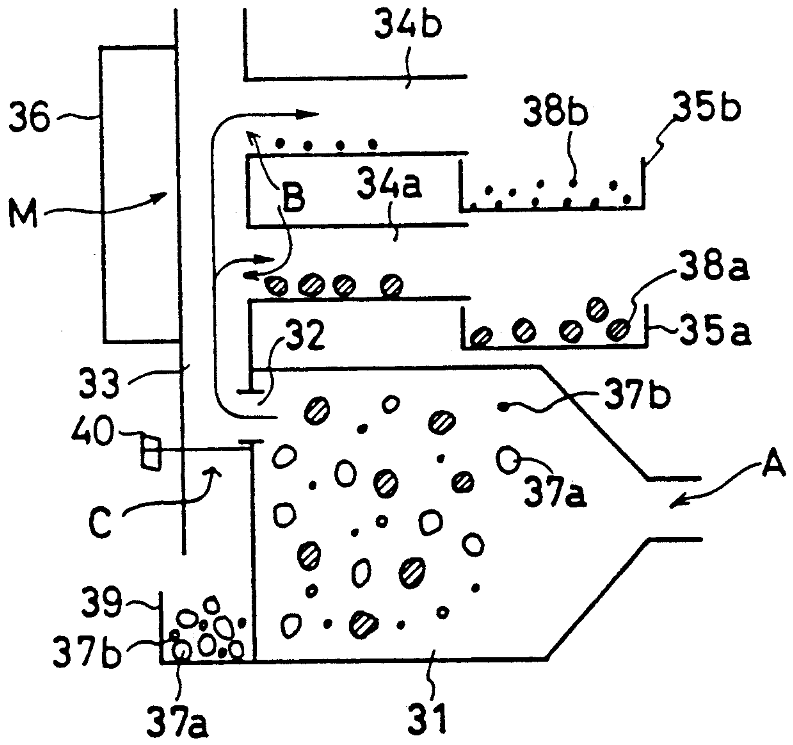
Figure 30:
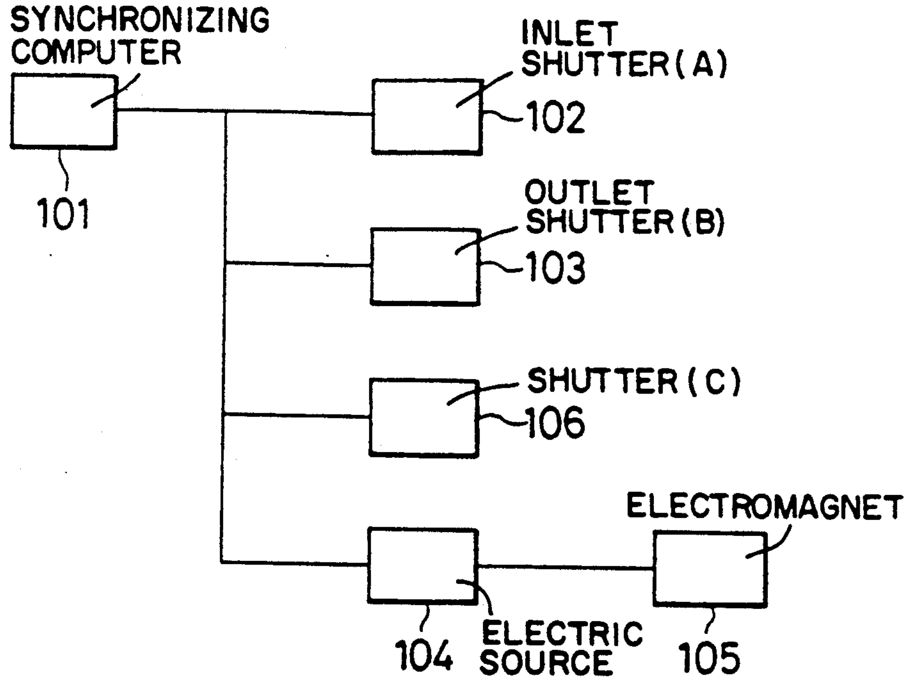
FIGS. 30 and 31 respectively illustrate a block diagram and a time chart of another controlling system in the apparatus of the present invention.
Figure 31:
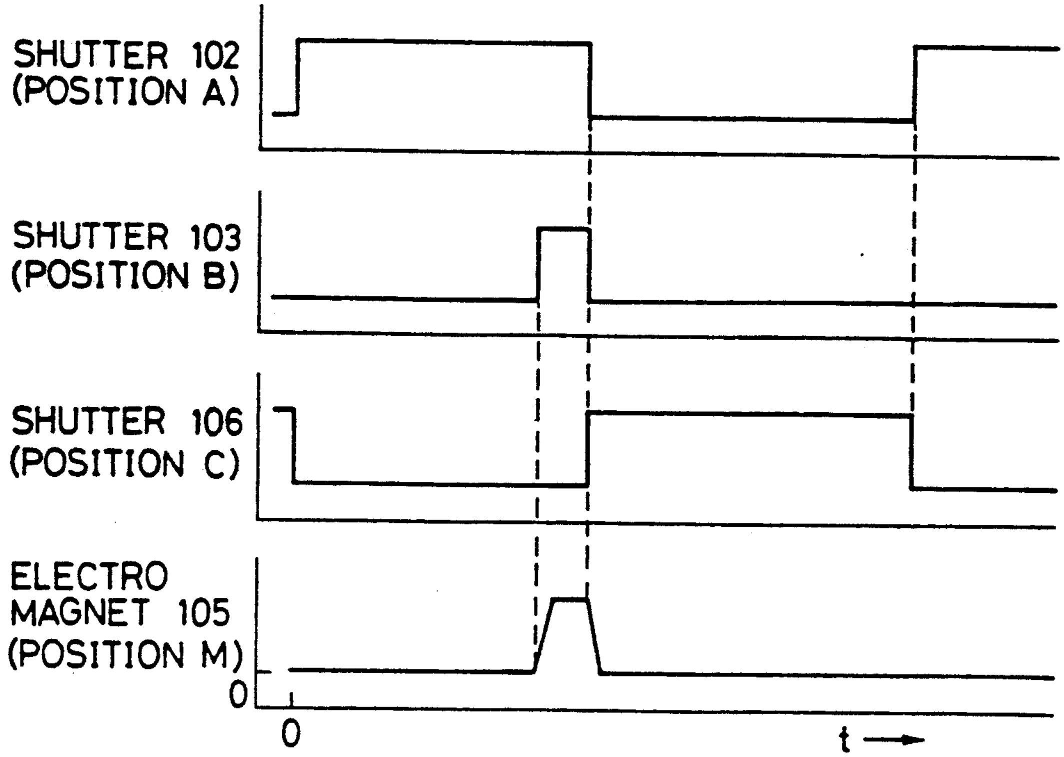

In an instance where means for collecting non-superconductors is provided (exemplified in FIG. 15 of the apparatus of an Example described later), equipped is a shutter 106 (at Position C in FIG. 15). A block diagram and a time chart in a controlling system for that instance are shown in FIG. 30 and FIG. 31, respectively. Operations are the same as described above. The shutter 106 turns "close" when the shutter 102 is "open", and the shutter 106 turns "open" when the shutter 102 is "close".

In the above apparatus, the various conditions such as the type of the above carrier gas, the flow rate, the flow quantity and the width of the slit may be suitably selected according to the desired particle diameter range.

A third embodiment of the apparatus of the present invention is a purification-classification apparatus for superconductor fine particles, comprising a container filled with a fluid such as helium gas or liquid nitrogen, means for allowing the powder containing superconductor fine particles to fall in said container, means for maintaining said fluid and said powder to a temperature not higher than the superconductive transition temperature of the desired superconductors, one or more partition means horizontally provided in a path for allowing said powder to fall and provided with a slit at a certain part, and means for alternately applying, with an appropriate period, magnetic fields having inclinations in the two directions facing each other in the plane rectangular to the falling direction of said powder, where said slit is suitably disposed, and made to be opened or closed or moved so that only the superconductor fine particles having a particular settling velocity may be passed through the slit to selectively remove only the superconductor fine particles having the desired particle diameter.

According to the present embodiment, the powder to be purified is kept at a temperature not higher than the critical temperature Tc and allowed to fall in a fluid such as helium gas or liquid nitrogen, and, in a zone at which the fine particles having the desired particle diameter have reached the terminal settling velocity, the magnetic fields having the inclinations opposite form each other are made to be alternately applied with an appropriate period to the fine powder that is settling in the above zone, so that only the fine powder existing in the superconducting state is made to generate a settling orbital path in a zigzag fashion by the repulsion caused by the Meissner effect. At the same time, a suitable number of partition panels are disposed in a suitable number in the above zone, and slits are provided at certain parts of the partition panels, which slits are suitably arranged or the slits are made to open or close with an appropriate period so that only the superconductor fine particles having a particular settling velocity may be passed through them, thus carrying out the purification and classification simultaneously.

In the above apparatus, the magnetic field applying means may be any of a permanent magnet and an electromagnet, without any particular limitation in its shape.

The opening and closing of the nozzle and the shutters for slits and the on-off of the electromagnets are electrically controlled and synchronized, for example, in the following manner.

Figure 32:
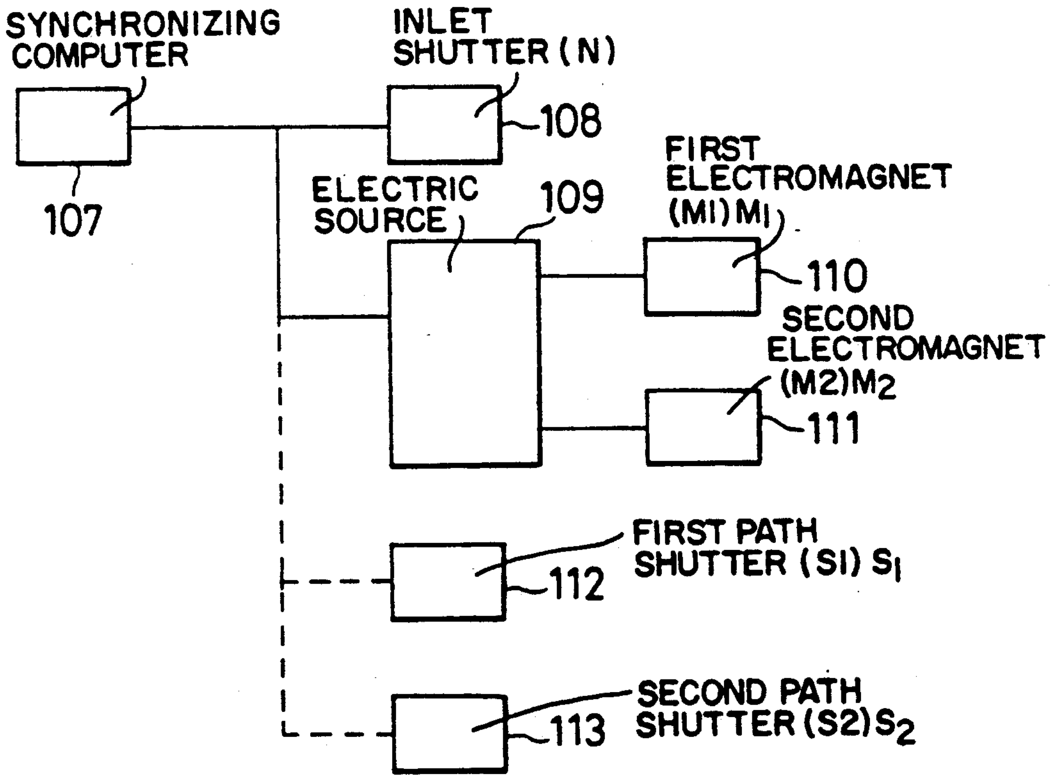
FIGS. 32 and 33 respectively illustrate a block diagram and a time chart of still another controlling system in the apparatus of the present invention.

FIG. 32 illustrates a block diagram of a controlling system (The illustrated example premises the apparatus exemplified in FIG. 17 and FIG. 18 to be described later). The numeral 107 denotes a controlling computer; 108, a shutter to open or close a nozzle (Position N in FIG. 17); 109, an electric source for the electromagnet; 110, an electromagnet to apply a first magnetic field (Position $M_1$ in FIG. 17); and 111, an electromagnet to apply a second magnetic field (Position $M_2$ in FIG. 17). In an instance where two paths exist for the fall of powder (the apparatus exemplified in FIG. 18), there is added a shutter 112 to open or close the slit belonging to a first path (Positions $S_1$, $S_1'$ and $S_1''$) and a shutter 113 to open or close the slit belonging to a second path (Positions $S_2$, $S_2'$ and $S_2''$.

Figure 33:
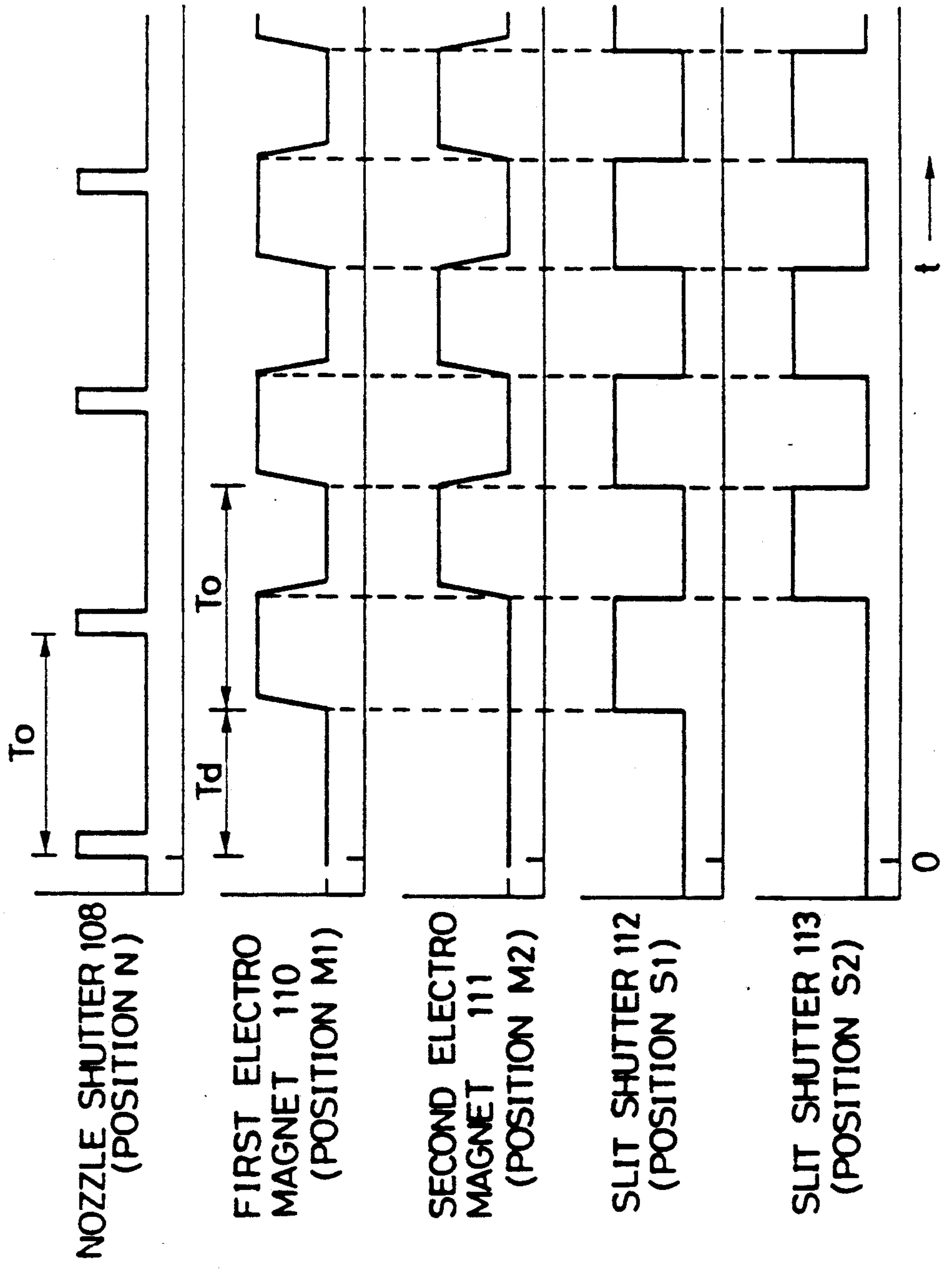

The above shutters and electromagnets are driven, and synchronized as a whole, for example, according to the time chart as shown in FIG. 33. The abscissa indicates the time.

The driving pulse is indicated in respect of each shutter, which turns "open" by the rise of the pulse and turns "close" by the fall of the pulse. Electric currents are indicated in respect of the electromagnets.

The period $T_o$ for driving the shutters and electromagnets has the following relationship with the terminal settling velocity $V_f$ of the desired superconductor fine particles and the distance Q of the partition panels:

$$T_0 = \frac{2l}{V_f}$$

Provided that this relationship can be precisely established when the falling locus of the superconductor fine particles is not so much deviated from the straight line, thus actually requiring some experiential correction.

The deviation $T_d$ in the timing between the opening and closing of the shutter of the nozzle and the driving of other parts corresponds to the time by which the powder to be purified are released form the nozzle to reach the zone at which the purification is effected, or the time remaining when the time of integer times of $T_o$ has been deducted from that time, and can be found through experience so that the quantity of the superconductor fine particles collected after purification may be maximized.

A fourth embodiment of the present invention is characterized by having a powder passage provided with means comprising a non-magnetic material serving as a wall material, for smoothing the flow of powder by vibrating this wall material, means for forming in said passage a flow of the powder containing superconductor fine particles, and means for applying a magnetic field in the direction vertical to the flow of said powder.

According to the present embodiment, provided as the magnetic field applying means are, for example, magnets provided in a multi-stage fashion along the vibrating passage, in the order of a magnet applying a weaker magnetic field to a magnet applying a stronger magnetic field. Thus the powder flowing in the passage and containing the superconductor fine particles are first applied with a weak magnetic field by means of the magnet applying a weak magnetic field. Thereby the superconductor fine particles in that flow of powder and having a larger particle diameter undergo a great deflection in their flying path. However, the superconductor fine particles having a smaller particle diameter are not deflected at all in their flying path or only deflected a little. This is because if the depth of penetration of the particles into the magnetic field is the same, the superconductor fine particles having a larger particle diameter suffer a larger repulsion owing to the Meissner effect. The superconductor fine particles that were not deflected or only a little deflected at that time are deflected in an applied magnetic field by a strong magnet provided at a downstream part of the passage, and thus can be classified and purified.

Deflecting the superconductor fine particles light in weight and small in particle diameter in this manner enables the classification and purification of the superconductor fine particles having a desired particle diameter range among the superconductor fine particles having a particle diameter of 0.2 μm or less.

In the above apparatus, the powder flow forming means may be any means so long as a flow of powder can be formed in the vibrating passage, and includes, for example, a means for directly blowing a carrier gas to the powder, and a means for allowing the powder to fall by gravity by making the vibrating passage upright or inclined. In the instance where the powder is allowed to fall by gravity, the vibrating passage may be filled with a suitable liquid to allow the powder to settle in the liquid.

There also is no particular limitation in the powder passage so long as it comprises a non-magnetic material that can be vibrated and serve as a wall material. The non-magnetic material may include, for example, glass, ceramics and aluminum. It can have a shape of a pipe, or various shapes such as an internally hollow V-shape, a box and a flat plate. The powder passage may also not necessarily be a hermetically closed passage, but may preferably be a hermetically closed passage when taking into account the purification and classification to be precisely carried out without being adversely affected by the outside wind, air flow or the like. As a preferred embodiment thereof, it may also include a vibrating passage equipped with collecting ducts on both sides, having a shape of an internally hollow V-shaped flat plate, and so provided that it is inclined with an inclination angle of 60° to 70°.

A vibration-generating means may be connected to such a passage to constitute the vibrating passage of the present embodiment. The vibration may not necessarily be required to be exerted to the whole passage, and may be exerted to the passage corresponding to the part at which the magnetic field is applied by the magnetic field applying means.

There is no particular limitation in the frequency of the vibration, but in general it may range approximately from 1 Hz to 20 kHz, and the vibration-generating means may be any of those that can give vibration to the passage, including a mechanical means employing a motor and a cam, or an ultrasonic vibrator employing a piezoelectric material (such as ZnO, AlN and PZT).

As described previously, the ultrasonic vibration plate that may be provided on the surface of the magnet in the first embodiment of the present invention is like the one in the present embodiment.

As having described above, employment of the apparatus of the present invention makes it possible to simultaneously and readily carry out the purification, classification and separation of superconductor fine particles having the desired purity particle diameter, critical temperature range and critical magnetic field range form among the powder to be purified, and the apparatus used in the process can be of small size and simple, with the course of the process capable of being visually observed. Moreover, the process can be carried out under a low pressure, and yet the above process is proceeded while forming the flow of the powder to be purified. Accordingly, a large quantity of powder can be purified in a high rate and high precision.

The apparatus of the present invention is also very useful in enhancing the purity of a superconductive sinter that contains impurities. More specifically, since the present invention can carry out the purification and classification in the order of a μm unit, the sinter can be very finely grounded and purified to the extent such that a superconductivity part and an impurity part may not coexist in its one fine particle. As a result, there can be obtained superconductive powder with high purity.

In the apparatus of the present invention, it is also further possible to obtain superconductor fine particles having uniform specific gravity, and thus possible to obtain superconductors with less intermixing of superconductors having different composition.

EXAMPLES

The present invention will be described below in greater detail by giving Examples and also with reference to the drawings.

EXAMPLE 1

Figure 2:
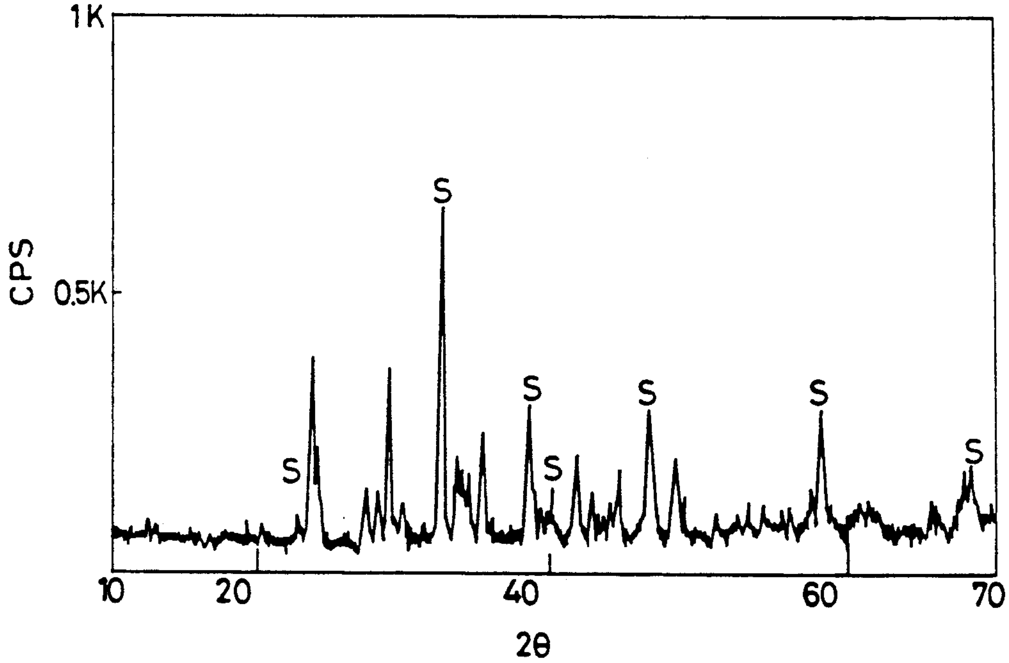
FIG. 2 is a graph showing an X-ray diffraction pattern of a superconductor containing impurities.

FIG. 1 illustrates an example of the apparatus of the present invention. The numeral 9 indicates superconductor fine particles having a relatively large particle diameter; 10, superconductor fine particles having a relatively small particle diameter of about 0.1 μm or less; and 7 and 9, superconductor fine particles having a relatively large particle diameter and non-superconductor fine particles having a relatively small particle diameter. In the present Example, the superconductive material to be classified and purified is $YBa_2Cu_3O_{7-\delta}$ ($O\leqq\delta\leqq0.5$). $Y_2O_3$, $BaCO_3$ and CuO were mixed in a ratio of Y:Ba:Cu=1:2:3, and the mixture was treated by heating for 2 hours at 950° C. in an atmosphere. The X-ray diffraction pattern obtained here is shown in FIG. 2. In FIG. 2, the peaks in the intended superconductor $YBa_2Cu_3O_{7-\delta}$ are indicated by "S". As will be clear from this figure, this sample contains a non-superconductor.

The mixture was ground in a mortar, and thereafter the settling velocity was measured in toluene to reveal that the settling velocity differs depending on the particle diameter, but the particles having the same particle diameter as a whole settled substantially in the same velocity. Accordingly, the superconductors and the impurity non-superconductors are considered to have substantially the same specific gravity.

First, powder containing superconductor fine particles and a carrier gas (as exemplified by He gas) having a temperature not higher than the critical temperature are mixed to make a mixed powder 1. This is ejected from an opening 2. The ejecting rate is selected depending on the specific gravity of powder or the particle diameter range as desired. The position of slits 11*a* and 11*b* of a partition panel 3 is made movable, and the width of the slits is selected by the particle diameter range as desired. Fine particles having a larger particle diameter are transported near the opening 2, and smaller fine particles having a smaller particle diameter, up to a distant place by the carrier gas. The powder having uniform particle diameter pass the slits and then fall by gravity, but at this time, because of a plate-shaped permanent magnet, the superconductor fine particles 9 having a relatively large particle diameter become apart from the surface of the magnet to pass over a partition panel 4*a* to fall. However, it may not occur that normal conductors, i.e., the fine particles 7 of non-superconductor (including conductors, semiconductors and insulators) pass over the partition panel 4*a*. The superconductor fine particles passed over the partition panel 4*a* are collected by a collection receptacle 6*a*. Similarly, the superconductor fine particles 10 having a relatively small particle diameter are also separated from the non-superconductor fine particles 8 by a permanent magnet 5*b* and a partition panel 4*b*, and collected in a collection receptacle 6*b*.

Figure 3:
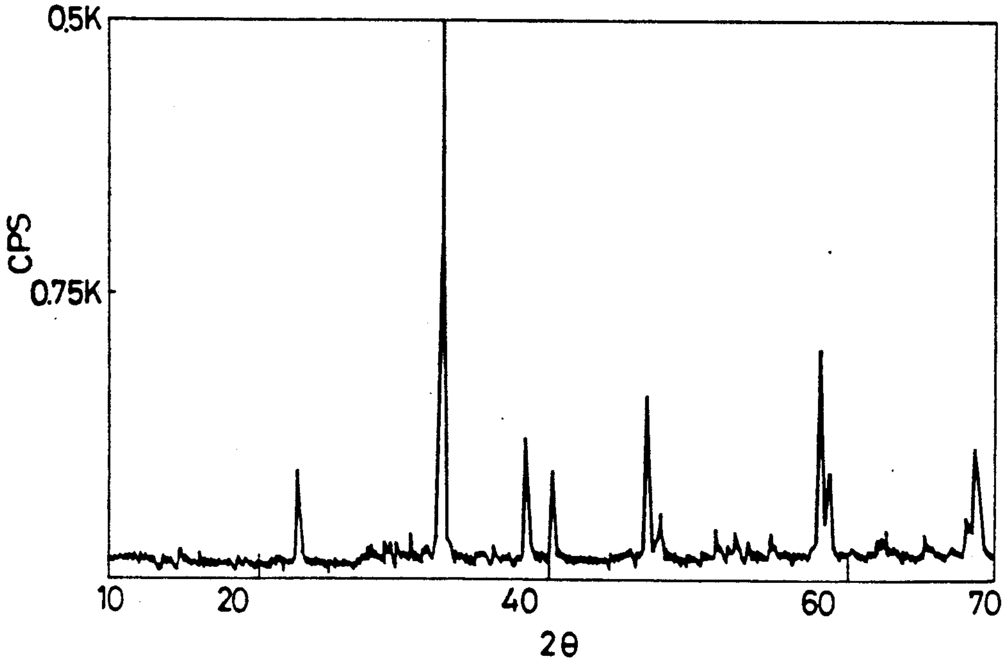

In the present Example, the classification and purification are carried out under the following conditions. In FIG. 1, the mixed powder 1 is ejected from the opening 2 at a flow rate of about 200 ml/min with use of the carrier gas comprising He gas. The He gas is beforehand cooled to a temperature of 70 K. or less by use of a cooling unit (not shown). The slit 11*a* has a space of 3 mm, and the slit 11*b*, 4 mm. The distance from the opening 2 to the slit 11*a* is 50 cm, and that from the opening 2 to the slit 11*b*, 150 cm. The permanent magnets are all comprised of Sm-Co and cooled to a temperature of 77 K. using a cooling unit (not shown). The partition panels 4*a* and 4*b* protrude by 4 mm from the surface of the magnets 5*a* and 5*b*. under the working conditions as described above, superconductors were able to be collected from about 5 g of raw material powder in the collection receptacle 6*a* in an amount of about 2.5 g, and in the collection receptacle 6*b*, about 2 g. The powder in this collection receptacle showed the X-ray diffraction pattern as shown in FIG. 3, resulting in disappearance of all the diffraction peaks of the non-superconductor fine particles in FIG. 2. Thus it was able to confirm that the present apparatus can make purification of superconductors. An electron microscope also revealed that superconductors of about 100 to 200 μm in particle diameter have been collected in the collection receptacle 6*a*, and those of about 10 to 50 μm in particle diameter, in the collection receptacle 6*b*, thus confirming the effect of classification.

EXAMPLE 2

In the case when the powder containing superconductor fine particles having a large particle size distribution and at the same time contain large particles of about 100 μm or more in particle diameter, the opening 2 is made to have the shape of a nozzle, and powder flow is ejected from the nozzle-shaped opening 2 so that the ratio of the pressures of the carrier gas before and after passing the nozzle-like opening 2 may be 10:1 or more. This operation enables the classification of the superconductor fine particles with a high efficiency like in Example 1 even if the powder contains those having a particle diameter of about 100 μm or more.

EXAMPLE 3

It may often occur that superconductor phases having different critical temperatures coexist if ceramics having the composition such as $YBa_2Cu_3O_x$ (x=6.00 to 7.00) or $Bi_2(Sr, Ca)_3 Cu_2O_{12-x}$ (x>0) are sintered under the same conditions. In such as instance, used is an apparatus having functions as shown in FIG. 4.

Figure 4:
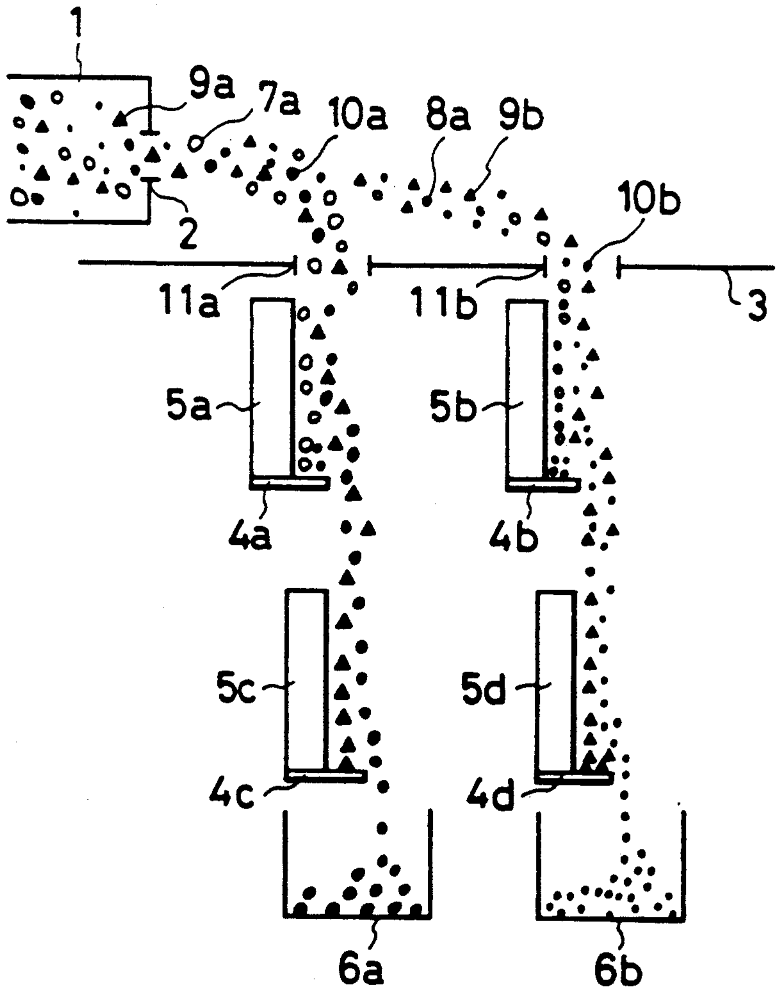

In FIG. 4, the numeral *7a* indicates non-superconductor fine particles having a relatively large particle diameter; 8*a*, non-superconductor fine particles having a relatively small particle diameter; and 9*a*, 9*b*, 10*a* and 10*b* each superconductor fine particles, where 9 indicates a higher critical temperature than 10, and a indicates those having a relatively large particle diameter, and b, those having a relatively small particle diameter.

Figure 5:
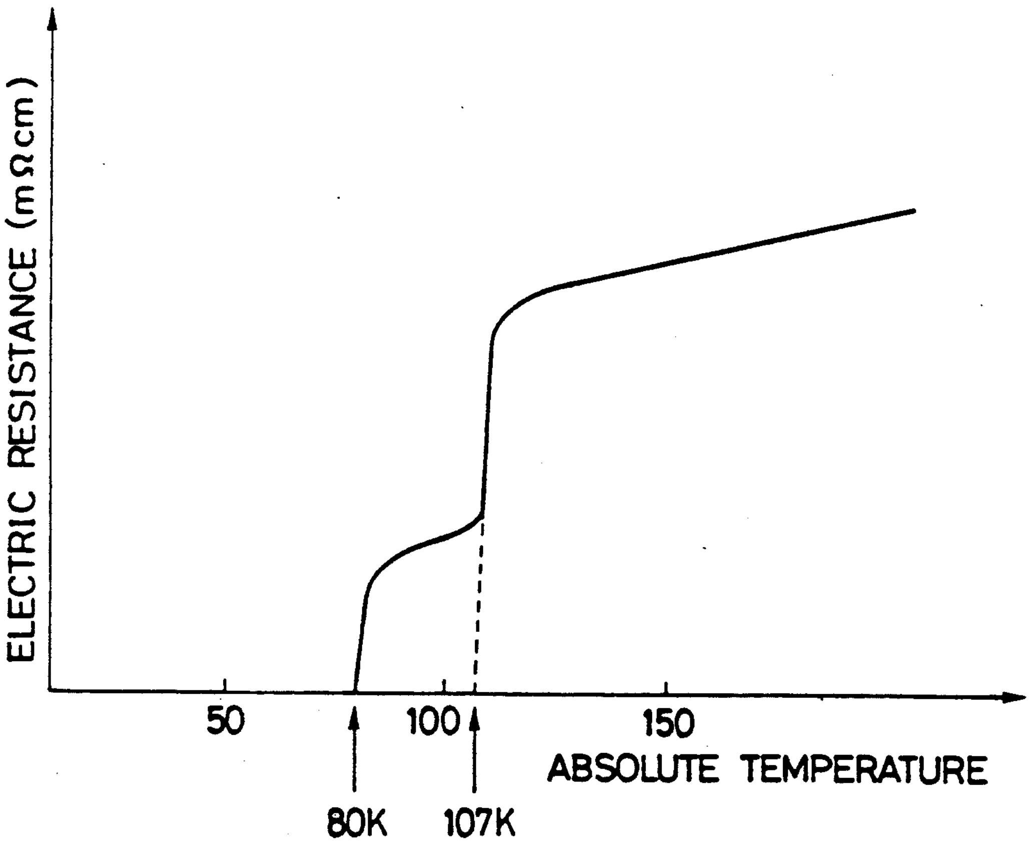
FIG. 5 is a graph showing temperature dependency of the electric resistance of a superconductor.

The temperature dependence on the electric resistance of the superconductors used as samples of the present invention is shown in FIG. 5. As will be seen from FIG. 5, there exists a crystal phase that exhibits superconductivity at 107 K. or less.

In a mortar, about 10 g of raw material powder is ground, and this is ejected from an opening 2 of 5 mm in diameter at a flow rate of about 300 ml/min by using He gas cooled to about 60 K. as a carrier gas. Sm-Co magnets 5*a* and 5*b* at the upper stage are beforehand cooled to 50 K. by means of a cooler (not shown) and Sm-Co magnets 5*c* and 5*d* at the lower stage are similarly beforehand cooled to 90 K. The partition panels 4*a* and 4*b* at the upper stage protrude by 4 mm from the surface of the magnets and the partition panels 4*c* and 4*d* at the lower stage protrude by 3 mm. As a result, superconductors (critical temperature: 107 K.) having a particle diameter of about 100 to 400 μm were collected in the one collection receptacle 6*a* and those having a particle diameter of about 30 to 50 μm were collected in the other collection receptacle 6*b* in an amount of about 0.05 g and 0.08 g, respectively. On the partition panels 4*c a*and 4*d*, also collected were 3 g and 5 g, respectively, of superconductors having a critical temperature of 80 K. Meanwhile, the slits 11*a* and 11*b* are both 5 mm in width, and the slit 11 is 70 cm distant and the slit 11*b* is 200 cm distant, from the opening 2.

EXAMPLE 4

Figure 6:
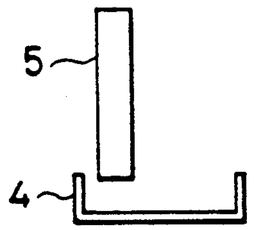
FIG. 6 illustrates constitution of another example of a magnet and a partition panel part of the apparatus of the present invention.

In examples 1 to 3, the magnets and the partition panels at the bottom parts thereof, as exemplified by the magnets 5*a* and 5*b* and the partition panels 4*a* and 4*b* in FIG. 1 had the shapes of flat plates. The partition panels 4*a* and 4*b* are made to have the shapes having edges fitted on their both ends as shown in FIG. 6, and in some instances the partition panels are made continuously movable according to a belt conveyor system. This makes it possible to separate a large quantity of powder.

EXAMPLE 5

Figure 7:
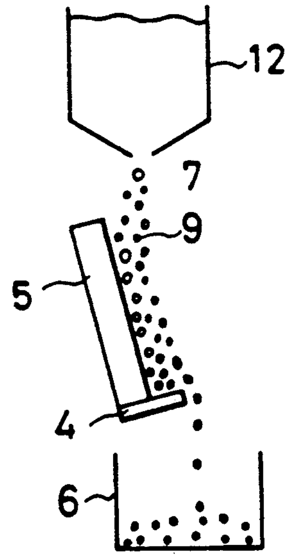

In the instances where the powder containing superconductor fine particles have relatively uniform grain size and no further classification is required as in Examples 1 to 4, no carrier gas is required, and the superconductor fine particles can be separated by allowing the powder to fall on a magnet 5 as shown in FIG. 7.

More specifically, the powder is allowed to fall from a container 12 holding the powder containing superconductor fine particles, and the powder may be brought to slip down the surface of the magnet 5 by appropriately selecting the inclination of the magnet 5 form a vertical position according to the particle diameter of the powder, so that only the superconductors 9 kept apart from the magnet surface pass over the partition panel owing to the Meissner effect and are collected in a collection receptacle 6.

EXAMPLE 6

Figure 8:
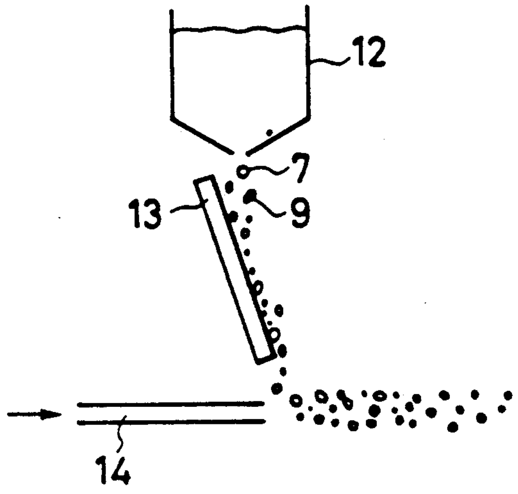
FIG. 8 illustrates constitution of another example of a powder-feeding means in the apparatus of the present invention.

As shown in FIG. 8, powder is allowed to fall from the container 12 holding the superconductors 9 to make the apparent shape of the powder falling on a slip board 13 to be of thin plate, to which a carrier gas is blown through a gas-introducing pipe 14. The classification of the superconductor fine particles can be carried out in the same manner as in Example 1 except for transporting the powder in this manner.

EXAMPLE 7

Figure 9:
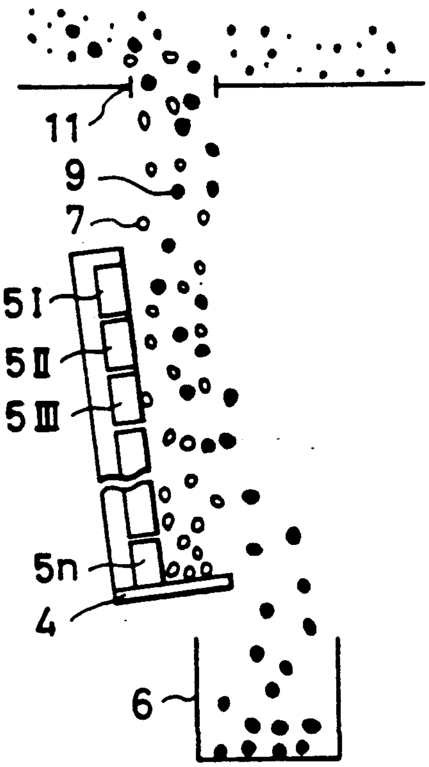
FIGS. 9, 10 and 19 each illustrate constitution of another example of a means for applying magnetic field in the apparatus of the present invention.

In examples 1 to 5, the means for applying the magnetic field is constituted of a plurality of electromagnets 5I, 5II, 5III, . . . and 5*n* as shown in FIG. 9, so that the on-off of the above electromagnets may be repeated (in the order of 5I→5II→5III→. . . 5*n*→5I) by a means (not shown) for controlling the application of magnetic fields, in succession in the falling directions of from 5I to 5*n* and with an appropriate period. This makes it possible to attempt to simplify the purification process and separate a large quantity of powder.

The period of the on-off of the magnetic fields may be selected according to the velocity of the powder flow, and also the magnetic fields may be made stronger in succession from 5I toward 5*n*.

EXAMPLE 8

Figure 10:
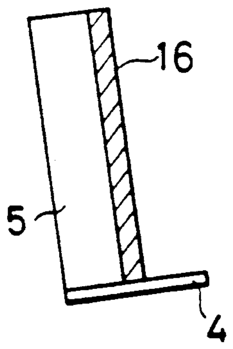

As a further feature to Examples 1 to 5 and 7, FIG. 10 shows a vibration plate 16 disposed on the surface of a magnet 5. The vibrating plate ultrasonically vibrates by use of an ultrasonic oscillator (not shown). This makes it possible to prevent the powder to be purified from being deposited on the magnets, which makes efficient the purification process, and separates a large quantity of the powder.

EXAMPLE 9

Figure 11:
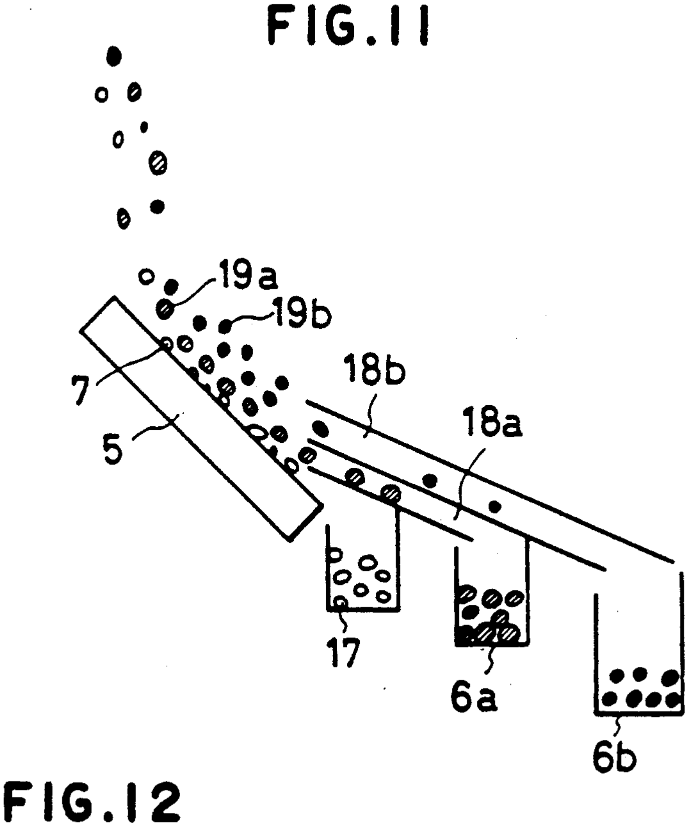
FIG. 11 illustrates constitution of another example of a powder-collecting means in the apparatus of the present invention.
Figure 12:
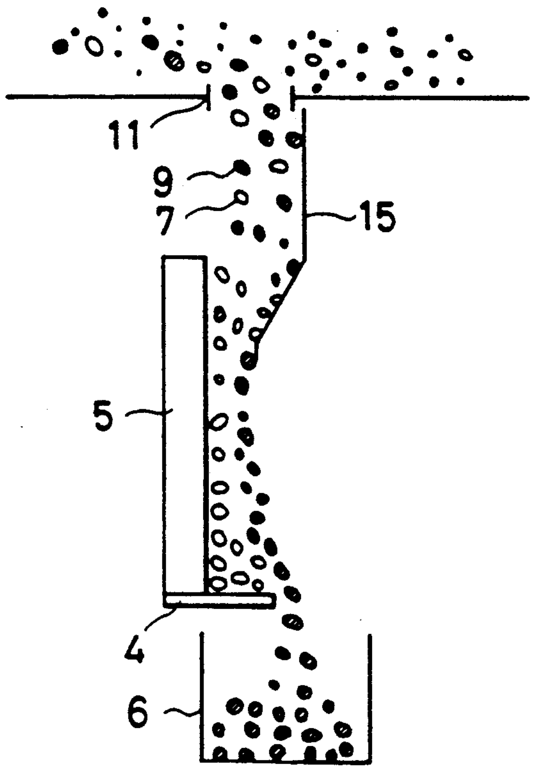

In instances where the powder containing superconductor fine particles have a relatively uniform particle diameter so that no further classification may be required, a collecting means as shown in FIG. 11, may be provided after the same classification and purification as in Example 1, so that the superconductor fine particles can be separated according to the difference in the specific gravity.

In FIG. 11, the numeral 19*a* denotes superconductor fine particles having relatively high specific gravity; 19, superconductor fine particles having relatively low specific gravity; and 7, non-superconductor fine particles, where all of these fine particles have substantially the same particle diameter.

The collecting means in the present embodiment comprises passages 18*a* an 18*b* and superconductors collection receptacles 6*a* and 6*b*, and is constituted such that the powder to be purified falls on the slant of a magnet 5, and the non-superconductor fine particles 7 in the powder continue to come into contact with the slant until they slip down in an impurities receptacle 17.

It is also constituted such that the superconductor fine particles 19*b* having a relatively light specific gravity become greatly separated from the magnet 5 owing to the magnetic field applied, and the superconductor fine particles 19*a* having a relatively heavy specific gravity are not so separated from it so that the distribution of the flows according to the specific gravity can be formed.

It is also constituted such that each of the superconductor fine particles 19*a* and 19*b* in that distribution can be collected by superconductors collection receptacles 6*a* and 6*b* through the passages 18*a* and 18*b*.

The distance of the passages 18*a* and 18*b* from the magnet 5 in this apparatus and the inclination of the magnet 5 may be appropriately selected to find an optimum value according to the desired particle diameter and specific gravity. To carry out the classification and separation with further precision as to particle diameter and specific gravity, the passages 18*a* and 18*b* may be made to have a narrower width and the number of the passages may be increased.

EXAMPLE 10

If the spacing of the slits become broader, it can be contemplated, for example, in FIG. 1 that the non-superconductors pass over the partition panels 4*a* and 4*b* to mix into the collection receptacle. In such an instance, a flow-deflecting device 1 (as exemplified by a baffle) may be provided, so that the precision of the classification and purification can be improved.

EXAMPLE 11

Figure 13:
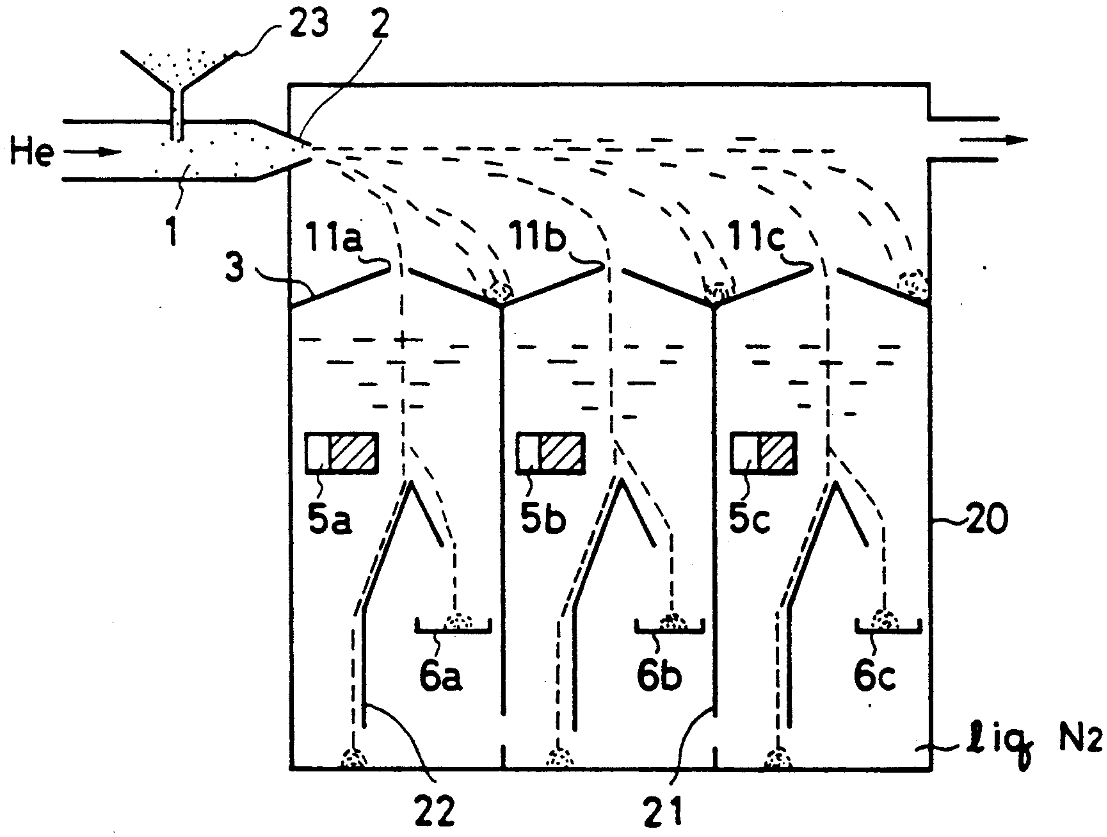

The apparatus illustrated in FIG. 13 comprises a container 20, a diaphragm 21, a partition panel 3, a nozzle 1, an a funnel 23. The inside of the container is kept at about 70 K., and its lower part is filled with liquid nitrogen. The upper part thereof is filled with helium gas blown in from the nozzle together with sample powder.

The sample powder blown out form the nozzle falls from slits 11*a*, 11*b* and 11*c* corresponding to the respective superconductor to enter into the liquid nitrogen. Magnets 5*a*, 5*b* and 5*ca* are provided in the vicinity of the powder-falling orbital path, and the superconductor fine particles are deflected in their orbital path by the repulsion owing to the Meissner effect and gathered in saucers 6*a*, 6*b* and 6*c*. The non-superconductor particles fall straight near the magnets and are selected and separated from the superconductors.

In the present Example, the heat capacity of the liquid is larger by far than that of the gas so that the samples which fall into the liquid immediately come to have the same temperature as the liquid. Thus, this example is characterized by having a precise temperature at the time of purification.

In the above Example, the magnets are all permanent magnets, but the magnetic fields may be applied to the powder by use of electromagnets to obtain quite the same effect. The slits are provided on the partition panels 3 at three points, but the slits may be made small in width and large in the number to effect precise classification of particle diameter. There are no particular ;limitations i the width and number of the slits. Alternatively, a vessel that can be moved by a belt conveyor or the like may be used in place of the slits, and this may, for example, be moved in the direction perpendicular to the paper surface of FIG. 13, and thereafter may be allowed to fall on the magnet areas.

Moreover, it is needless to say that the particle size distribution of the superconductor fine particles collected in the collection receptacle 6 may not be affected at all even if there is a great difference in the specific gravity between the superconductors and non-superconductors.

EXAMPLE 12

Figure 14:
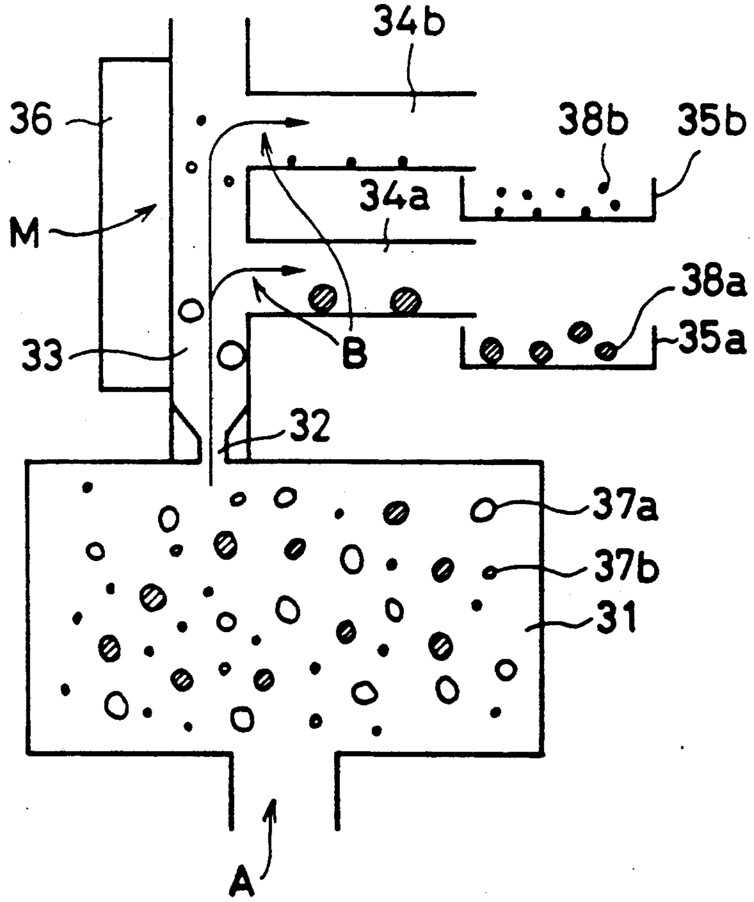

FIG. 14 is a schematic view illustrating another example of the apparatus of the present invention. In FIG. 14, the numeral 38*a* denotes superconductor fine particles having relatively large particle diameter; 39*a*, superconductor fine particles having a particle diameter of about 0.1 μm or more but a relatively small particle diameter; and 37*a* and 37*b*, non-superconductor fine particles.

The floating means in this Example comprises a powder container 31, an opening 32 and a carrier gas ejector (not shown). The magnetic field applying means comprises a magnet 36.

This apparatus is so constituted that the powder to be purified contained in the powder container 31 can be floated by the carrier gas from the powder container 31 to a vertical passage 33 through the opening 32. The fine particles 37*a* and 38*a* having relatively large particle diameter among the powder floated in the vertical passage 33 float only up to a lower position, but the superconductor fine particles 37*a* and 38*b* having relatively small particle diameter float up to a higher position. In this FIG. 14, all the superconductor fine particles and non-superconductor fine particles are assumed to have substantially constant specific gravities. The ejection rate at this time may be selected according to the specific gravity of the powder or the desired particle diameter range. The position, width and number of the vertical passage 33 and horizontal passages 34*a* and 34*b* may also be selected according to the desired specific gravity and particle diameter.

The apparatus is further constituted such that once a magnetic field is applied by a magnet 36 to the powder inside the vertical passage 33 which have floated to different heights depending on the particle diameter, the respective superconductor fine particles 38*a* and 38*b* move to the respective horizontal passages 34*a* and 34*b* by the action of the repulsion caused by the Meissner effect, and are collected in the collection receptacles 35*a* and 35*b* for the respective superconductor fine particles.

It is also constituted such that the non-superconductor fine particles 37*a* and 37*b* staying inside the vertical passage 33 fall into the powder container 31 by stopping the ejecting of the carrier gas or by turning down the gas.

Employing this apparatus makes it possible to simultaneously and readily carry out the classification-separation according to the particle diameter and/or specific gravity by floating the powder with use of a carrier gas, and the purification by applying the magnetic field to the powder.

In regard to the flow rate of the carrier gas and the driving timing $t_1$, $t_2$ and $t_3$ previously mentioned, the flow rate is 300 ml/min; $t_1$, 20 seconds; $t_2$, 5 seconds; and $t_3$, 1 minute in instances where, for example, the superconductor fine particles to be classified contains even the fine particles of about 1 to 3 μm in particle diameter.

In instances where the particles having a relatively large particle diameter of about 10 to 30 μm are classified, the flow rate is 1 lit/min; $t_1$, 20 seconds; $t_2$, 5 seconds; and $t_3$, 20 seconds, in approximation, which are typical values.

EXAMPLE 13

FIG. 15 is a schematic view illustrating an apparatus constituted by providing in the apparatus shown i FIG. 14 an impurities collection receptacle 39 and a closing flap 40, and arranging the opening 32 in the horizontal direction.

This apparatus is constituted such that when the non-superconductor fine particles 37 and 38 staying inside the vertical passage 33 are allowed to fall by stopping the ejecting of the carrier gas or by turning down the gas, they fall into the impurities collection receptacle 39 if the closing flap 40 is opened. Accordingly, the non-superconductor fine particles 37 and 38 may not return to the inside of the powder container 31 to enable the purification with good efficiency. Since moreover the direction of flow of the carrier gas containing the powder greatly changes, the powder tends to be uniformly distributed inside the vertical passage 33.

The flow rate of the carrier gas and the values for $t_1$, $t_2$ and $t_3$ are the same as in the case of Example 12.

EXAMPLE 14

In the case when the powder containing superconductor fine particles has a large particle size distribution and at the same time contain large particles of about 100 μm or more in particle diameter, the opening 32 of the apparatus illustrated in FIG. 14 or FIG. 15 is made to have the shape of a nozzle, and powder flow is ejected from the nozzle-shaped opening 2 so that the ratio of the pressure of the carrier gas before and after passing the nozzle-like opening 2 may be 10:1 or more. This operation enables the classification of the superconductor fine particles with good efficiency like in Example 1 even if the powder contains particles having a diameter of about 100 μm or more.

EXAMPLE 15

Figure 16:
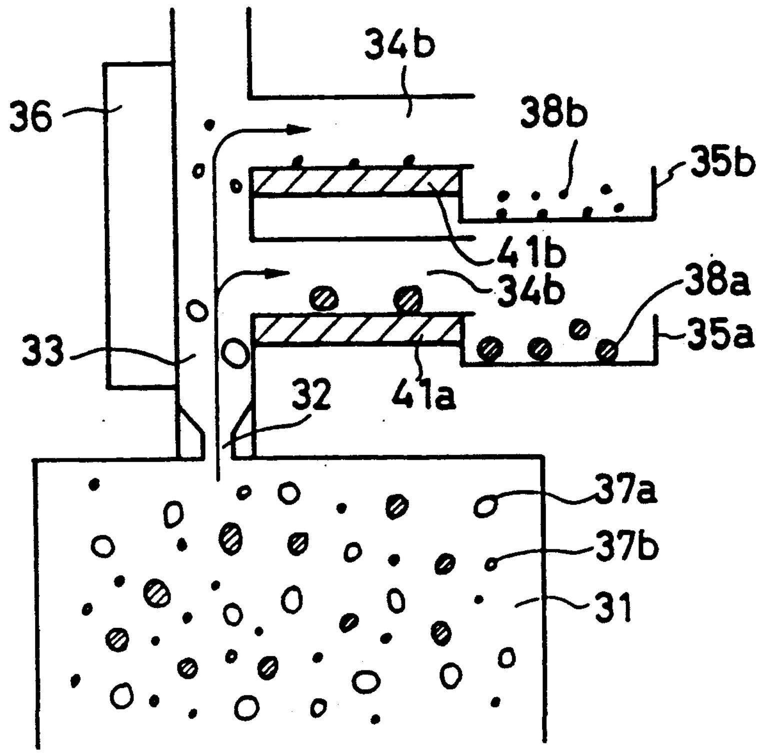

FIG. 16 illustrates an apparatus constituted by providing ultrasonic vibration plates 41*a* and 41*b* respectively at the bottom surfaces of the horizontal passages 34*a* and 34*b* of the apparatus illustrated in FIG. 14, or FIG. 15. In this apparatus, there is no friction resistance between the superconductor fine particles having moved from the vertical passage 33 to the horizontal passages 34*a* and 34*b*, and the bottom surfaces of the horizontal passages 34*a* and 34*b*, so that the superconductor fine particles can be efficiently transported to the collection receptacles 35*a* and 35*b* without stagnating on the way of the horizontal passages 34*a* and 34*b*.

EXAMPLE 16

In the apparatus shown in FIG. 14, FIG. 15 and FIG. 16, the magnet 36 was made to comprise an electromagnet, and the electromagnet was so provided that it can repeat on-off with a certain period while being synchronized with the powder-floating means by using a means (not shown) for controlling the application of magnetic fields. More specifically, the magnet was so provided that the magnetic field may be applied after the lapse of an appropriate time by which the particle size distribution of the powder formed in the vertical direction inside the vertical passage comes to a steady state after ejection of the carrier gas, and further that this operation may be repeated with a specified period.

Employment of such an apparatus further improves the precision in the classification of the superconductor fine particles.

Also, using the apparatus shown in FIG. 14, about 5 g of powder (showing the same X-ray diffraction pattern as in FIG. 2) containing the superconductor fine particles obtained in the same manner as in Example 1 were added to the flow of a carrier gas of a temperature not higher than the critical temperature (he gas; 70 K. or less), and this was ejected from the opening 32 at a flow rate of about 200 ml/min. The horizontal passage 34*a* was made to be 4 mm in width, and the horizontal passage 34*b*, 3 mm in width. The horizontal passage 34*a* was also made 5 cm apart from the opening 32, and 10 cm apart from the horizontal passage 34*b*.

Used for the magnet 36 was a permanent magnet (Sm-Co), and the inside of the apparatus was cooled to 77 K. by a cooling means (not shown) to carry out the process.

With respect to about 5 g of the raw material powder the process of the present invention was carried out. As a result, it was able to collect about 2.5 g of superconductor fine particles in the collection receptacle 5*a*, and about 1.3 g of superconductor fine particles in the collection receptacle 5*b*.

The X-ray diffraction pattern of the superconductor fine particles in the collection receptacles 35*a* and 35*b* resulted in the same as in FIG. 3.

From these results, it was able to confirm that the apparatus of the present invention can make purification of superconductors in good precision.

Observation of the superconductor fine particles in the collection receptacles 35*a* and 35*b* using an electron microscope also revealed that the fine particles in the collection receptacle 35*a* had a particle diameter of about 100 to 200 μm, and the fine particles in the collection receptacle 35*b*, about 10 to 50 μm. From these results it was able to confirm that the apparatus of the present invention can make classification of superconductors having a very small particle diameter.

EXAMPLE 17

Figure 17:
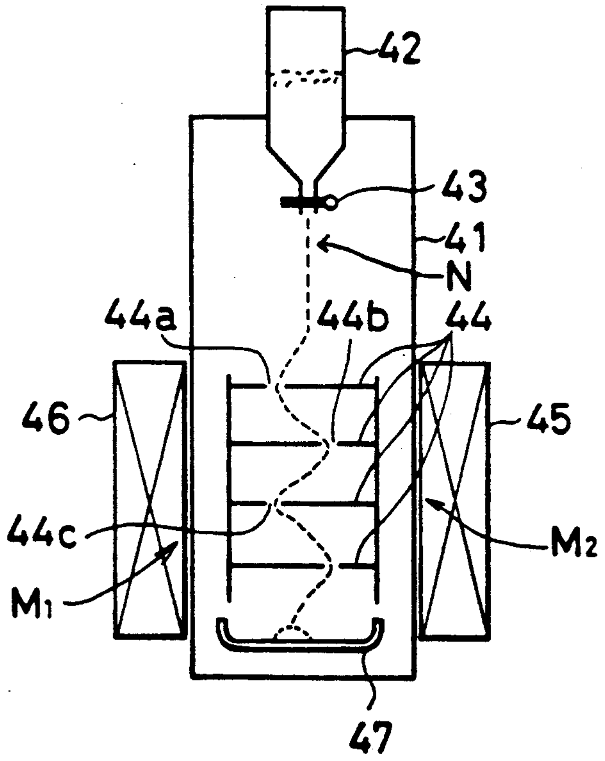

FIG. 17 is a cross section to explain the principle of another example of the apparatus of the present invention. In this FIG. 17, a helium gas chamber 41 is filed in its inside with helium gas maintained at a temperature not higher than Tc with an appropriate pressure. At an upper part of the helium gas chamber 41, a powder tank 42 equipped with a nozzle 43 at its lower end is provided, and powder to be purified and kept at a temperature not higher than Tc is held in the powder tank 42. The nozzle 43 opens or closes in agreement with the on-off period of a magnet described later. Inside the helium gas tank 41, partition panels 44 are disposed in plural stages that are spaced above and below, and a saucer 47 is provided at a lower part of a lowermost partition panel 44. In each of partition panels 44, slits 44*a*, 44*b*, 44*c*, etc. are formed at alternately shifted positions. At both outsides of the helium gas tank 41, a first magnet 45 and a second magnet 46 are provided facing each other.

In FIG. 17, the powder to be purified, contained in the powder tank 42 is allowed to fall from the nozzle 43 that opens or closes in agreement with the on-off period of the first and second magnets 45 and 46. When the powder fall inside the helium gas tank 41, its velocity reaches the terminal settling velocity which depends on the particle diameter. Thereafter the powder approaches the partition panels 44 having the slits in an alternate fashion. Here, the first magnet is excited, and the superconductor fine particles are subject to the repulsion owing to the Meissner effect to suffer deflection of the falling orbital path and pass the first slit 44*a*. Naturally, the powder that is not in a superconducting state can not pass the slit. Subsequently, after the magnetic intensity of the first magnet was lowered, the second magnet 46 is excited and the superconductor fine particles ar deflected to the opposite side to pass the next slit 44*b*. At this time, only the powder having a specific settling velocity can pas successively the slits 44*a*, 44*b*, 44*c*, etc. by appropriately selecting the on-off period so both the magnets 45 and 46 by using a means (not shown) for controlling the application of magnetic fields. As to the particles in which the superconductor phases and impurity phases coexist, even though having the same settling velocity, the repulsion owing to the Meissner effect is so small as compared with its mass that the moving distance to the lateral direction becomes small. For this reason, the positions of the slits 44*a*, 44*b*, 44*c*, etc. may be suitably selected to enable removal of such powder.

In this manner, the superconductor fine particles having been purified and classified are finally collected in the saucer 47.

In the present Example, the part that must be mechanically driven is only the nozzle 43 for allowing the powder to fall, and thus the object can be achieved by a very simple mechanism.

As to the distance between the partition panels and the values for $T_o$ and $T_d$ in instances where, for example, the superconductor fine particles of 5 μm in particle diameter are to be obtained, $T_o$ was 4.5 seconds and $T_d$ was 1.3 seconds when the distance is 5 cm.

EXAMPLE 18

Figure 18:
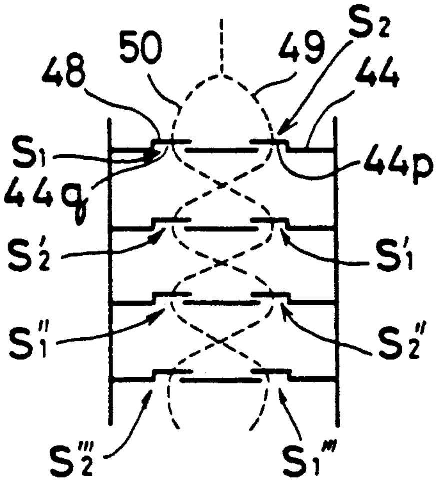
FIG. 18 illustrates constitution of another example of a partition means in the apparatus of the present invention.

FIG. 18 illustrates an apparatus constituted by modifying the partition panel 44 in the apparatus of the present invention shown in FIG. 17, wherein a shutter 48 is provided on every two slits 44*p* and 44*q* provided on each partition panel 44. Making this shutter 48 appropriately open and close makes it possible to pass both the powder passing through a settling path 49 and the powder passing through another settling path 50. In the apparatus of FIG. 17, it was possible to open the nozzle only once with respect to one on-off period of the magnets 45 and 46, but, it is possible according to this embodiment to open it twice, doubling the treatment capacity.

The distance of the partition panels and the values for $T_o$ and $T_d$ are the same as those in Example 17.

EXAMPLE 19

Figure 19:
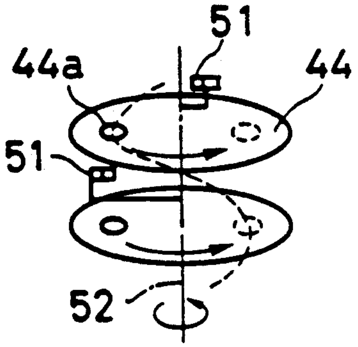
Figure 20:
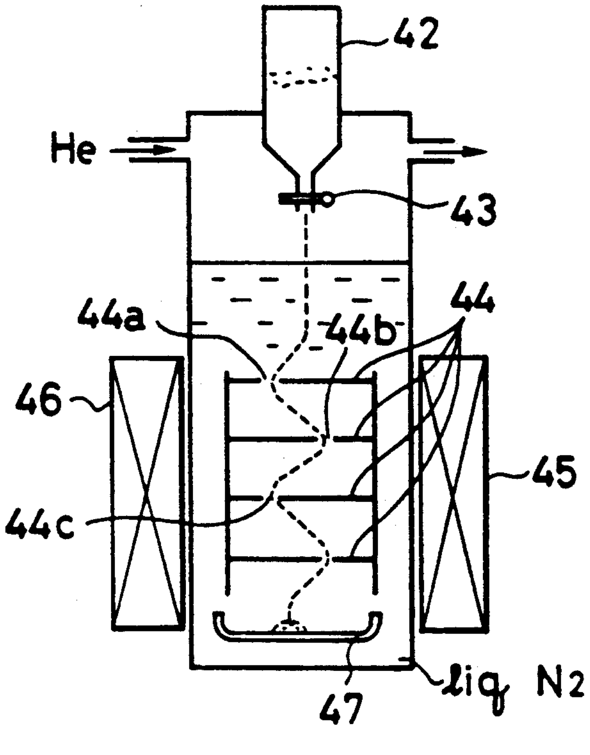

FIG. 19 illustrates an apparatus as in Examples 17 and 18 but comprising a disc-like barrier 44 having one opening 44*a*, and a permanent magnet 51 mounted in place of the electromagnet, both of which are rotated on a common rotating shaft with an appropriate period. In this instance, the powder can be continuously allowed to fall to carry out the purification and classification.

EXAMPLE 20

The present Example operates like Example 17. The inside of the apparatus is maintained at about 70 K., whose upper half is filled with helium gas, and lower half, with liquid nitrogen. The sample placed in a powder tank 42 falls in the liquid nitrogen when a nozzle 43 is opened, and settles at a terminal settling velocity according to the particle diameter of each particle. Magnetic fields having an inclination opposite to each other may be alternately applied to this settling particles with an appropriate period, so that only the superconductor fine particles having the desired particle diameter can be allowed to pass slits 44*a*, 44*b* and 44*c* provided on partition panels 44 and gathered on a saucer 47.

As compared with the case when only the liquid is sued this apparatus can be made small in size and can be used even with the powder having particles with a relatively large diameter.

EXAMPLE 21

Figure 21:
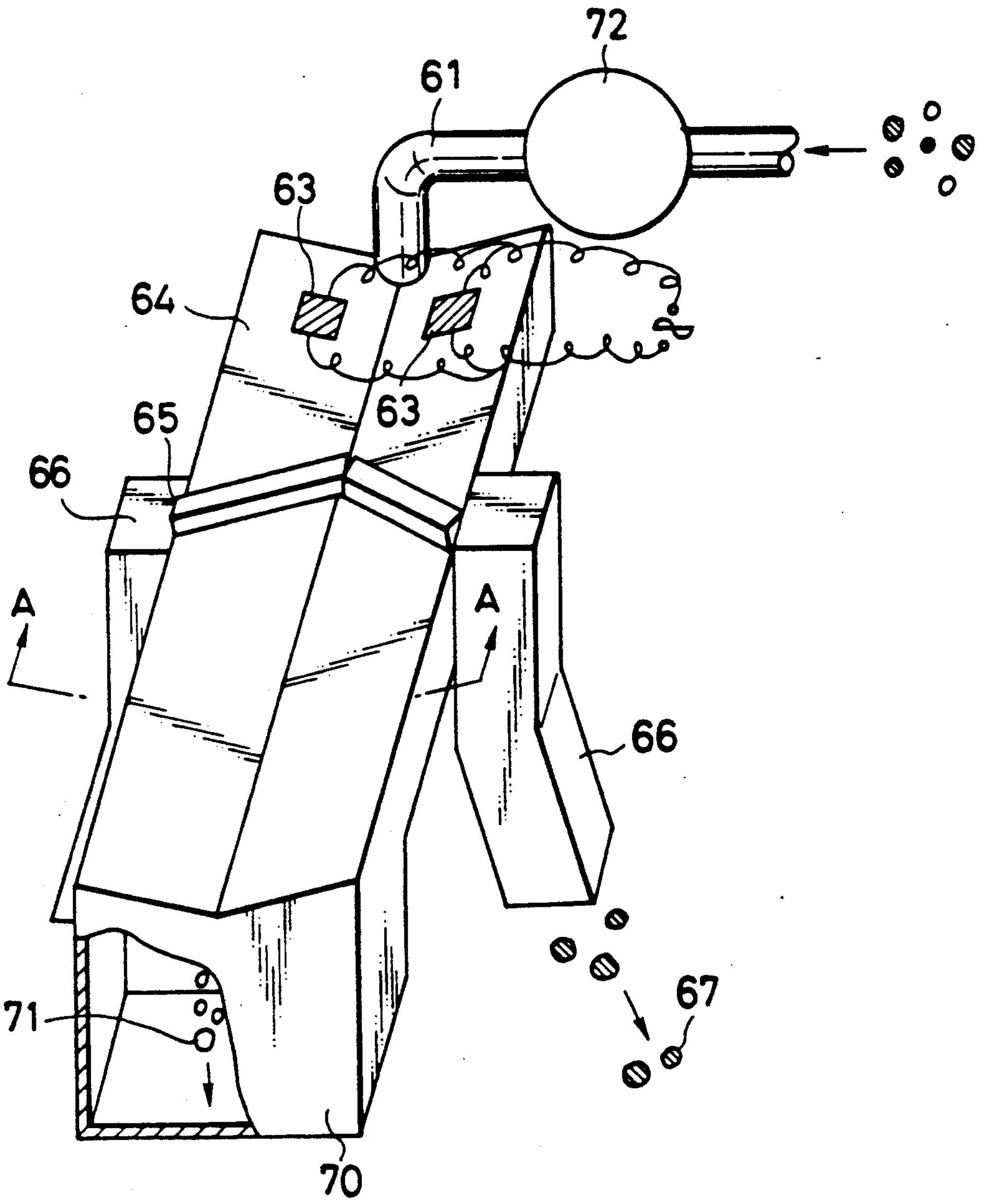
Figure 22:
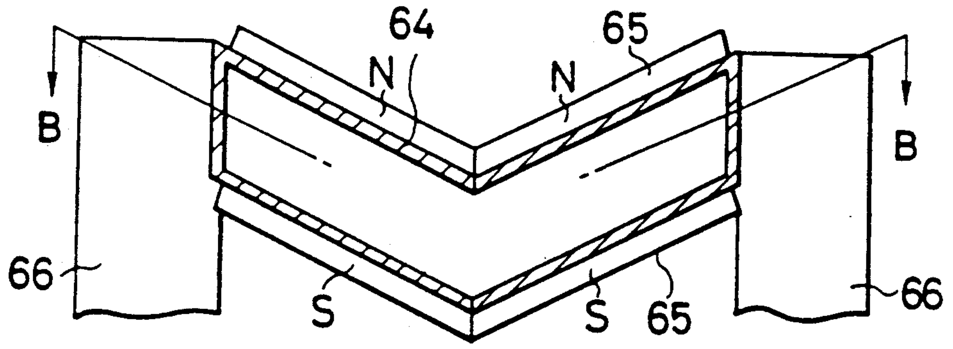
Figure 23:
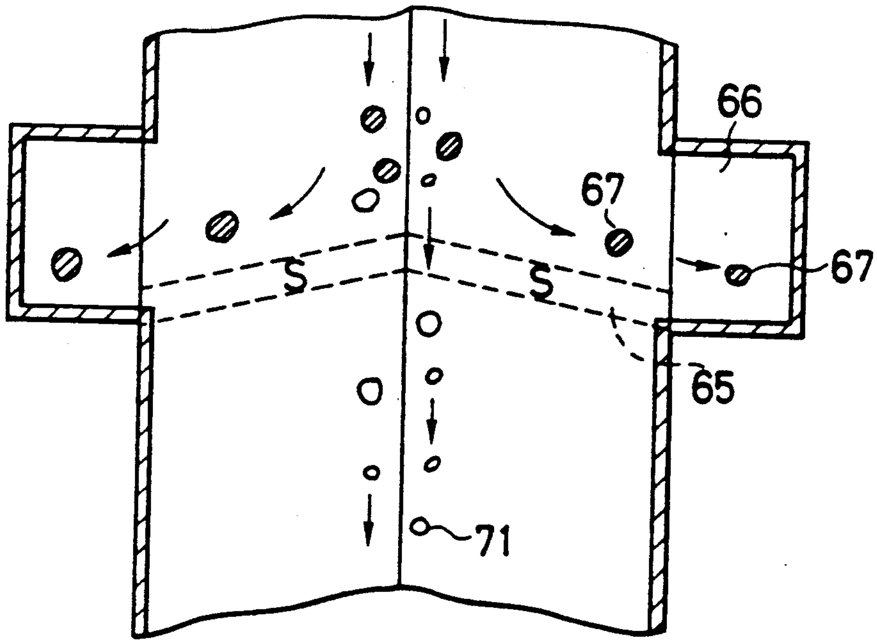

FIG. 21 is a perspective and side elevation illustrating still another embodiment of the apparatus of the present invention, FIG. 22 is a cross section along the line A—A thereof, and FIG. 23 is a cross section along the line B—B thereof.

In the apparatus of the present embodiment, the vibrating passage comprises a V-shaped frame 64 so provided as to be inclined with an angle of 60° to 70°, and an ultrasonic vibrator 63 connected thereto. The magnetic field applying means also comprises a magnet 65 set on the way of the frame 64.

An example of operational procedures for the apparatus in the present Example will be described below.

First, powder (particle diameter: about 0.1 μm or more) containing superconductor fine particles is transported from a storing vessel (not shown) to the frame 64 through a transporting pipe 61 by means of a feed pump 72.

Figure 25:
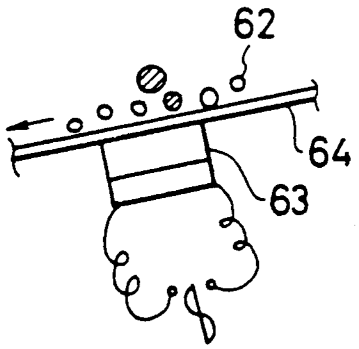

The frame 64 is ultrasonically vibrated by the ultrasonic vibrator 63, and thus the powder transported into the frame 64 falls as shown in FIG. 25 almost without suffering the frictional resistance of the inner wall of the frame 64.

When the powder approaches the area of the magnet 65 set on the way of the frame 64, a magnetic field is applied to the powder to deflect the falling path of only the superconductor fine particles 67 as shown in FIG. 23, which particles are guided in a duct 66 as shown in FIG. 21 and collected there.

Figure 24:
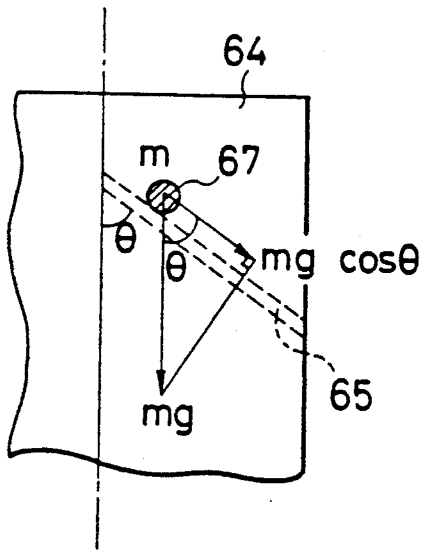
FIGS. 24 and 25 respectively illustrate motion of super conductive fine particles in the power passage.

FIG. 24 shows a state in which the superconductor fine particles 67 with its weight of mg are deflected along the magnet 65 set to have an inclination θ and with a gravity acceleration of g.cos θ (g: gravity acceleration degree). This applies to the case when the frame 64 was stood upright.

Impurity fine particles 61 other than the superconductor fine particles 67 are not deflected even when the magnetic field is applied, and thus fall in an impurities store vessel 70 as shown in FIG. 21 and collected there.

Operating in the above manner, it becomes possible to purify the superconductor fine particles by using the apparatus of the present Example.

In the present Example, the classification of superconductor fine particles having the desired particle diameter can also be carried out by using an electromagnet as the magnet 65 and controlling the strength of the applied magnetic field according to the desired particle diameter.

Using this apparatus and under the following conditions, it was able to purify superconductors in a good state form powder obtained after grinding a sinter of Y-Ba-Cu-O system. Frame size: 100 mm×300 mm;

applied magnetic field: 1,500 Gauss; powder flow density: 1 cc/min; distance between flat plates: 3 mm; and under a liquid nitrogen temperature.

EXAMPLE 22

Figure 26:
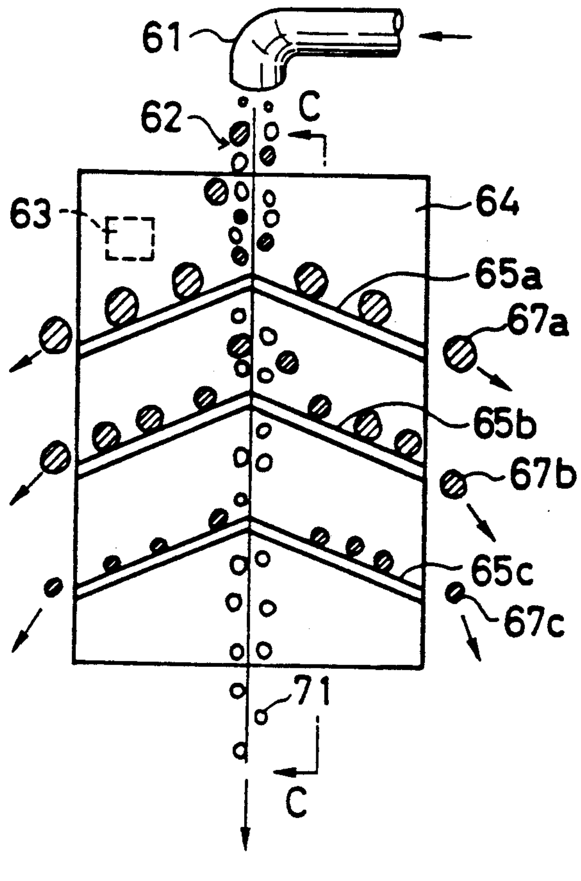
Figure 27:
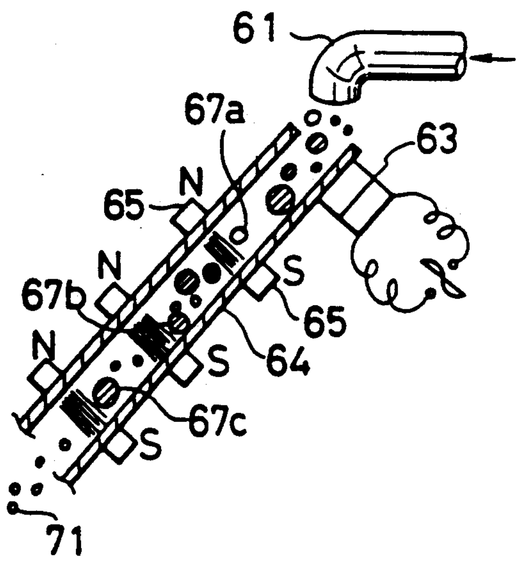

FIG. 26 diagramatically illustrates an example where a plurality of magnets are provided in the apparatus of Example 21, and FIG. 27 is a cross section along the line C—C thereof.

In the apparatus of the present Example, the vibrating passage comprises a flat plate frame 64 and an ultrasonic vibrator 63 connected thereto. The magnetic field applying means also comprises three magnets 65*a*, 65*b* and 65*c* *a*set on the way of the frame 64. The three magnets have the strength of applied magnetic fields in the order of 65*a*<65*b*<65*c*.

An example of operational procedures for the apparatus in the present Example will be described below.

First, in the same manner as the apparatus of Example 21, powder (particle diameter: about 0.1 μm or more) containing superconductor fine particles are transported to the frame 64 through a transporting pipe 61.

The frame 64 is ultrasonically vibrated by the ultrasonic vibrator 63, and thus the powder transported into the frame 64 falls almost without suffering the frictional resistance of the inner wall of the frame 64.

When the powder approaches the area of the magnet 65*a* set on the way of the frame 64, a weak magnetic field is applied to the powder to deflect the falling orbital path of only the superconductor fine particles 67*a* having relatively large particle diameter, and collected. Subsequently, similarly the superconductor fine particles 67*b* and 67*c* having the particle diameter corresponding to the magnitude of the applied magnetic fields of the magnets 65*b*, and 65*c* are successively deflected, and collected.

Fine particles 71 other than the superconductor fine particles 67*a*, 67*b* and 67*c* *a*are not deflected even when the magnetic field is applied, and thus fall in an impurities store vessel 70, and collected there.

Operating in the above manner, it becomes possible to classify the superconductor fine particles by using the apparatus of the present Example.

We claim:

1. A purification apparatus for superconductor fine particles, comprising;

- means for forming a flow of powder containing the superconductor fine particles along a flow path;
- means for applying a magnetic field to the flow of the powder; and
- an electrical control for controlling said mean for applying a magnetic field and said means for forming a flow of powder, wherein the application of the magnetic field is synchronized with the flow of the powder by said electrical control.

2. The apparatus of claim 1, wherein said means for applying a magnetic field comprises an electromagnet.

3. The apparatus of claim 1, wherein said means for applying a magnetic field is provided with a plurality of magnets disposed along the flow path of the powder.

4. The apparatus of claim 1, wherein said means for forming a flow of powder includes means for directly blowing a carrier gas to the powder.

5. The apparatus of claim 4, wherein said carrier gas serves as a coolant for the powder.

6. The apparatus of claim 1, wherein said means for forming a flow of powder allows the powder to fall due to the force of gravity.

7. The apparatus of claim 1, further comprising partition means having at least one slit provided in the path flow of the powder.

8. The apparatus of claim 1 further comprising collecting means for collecting the superconductor fine particles in a flow path deflected by said means for applying the magnetic field.

9. The apparatus of claim 1, further comprising first collecting means for collecting the superconductor fine particles in a flow path deflected by said means for applying the magnetic field, and second collecting means for collecting fine particles in another flow path not deflected by said means for applying the magnetic field.

10. The apparatus of claim 1, wherein the flow of the powder is formed in a coolant.

11. A purification apparatus for superconductor fine particles, comprising;

- means for blowing powder containing the superconductor fine particles in a horizontal direction by use of a carrier medium to form a flow of the powder along a flow path;
- partition means horizontally provided, having a plurality of slits at different distances from said blowing means; and
- means provided beneath said respective slits, for applying a magnetic field to the flow of the powder.

12. The apparatus of claim 11, wherein said means for applying a magnetic field comprises a permanent magnet.

13. The apparatus of claim 11, wherein said means for applying a magnetic field comprises an electromagnet.

14. The apparatus of claim 11, wherein said means for applying a magnetic field is provided with a plurality of magnetic disposed along the flow path of the powder.

15. The apparatus of claim 11, further comprising an electronic control for controlling said means for applying a magnetic field and said means for blowing, wherein the application of the magnetic field is synchronized with the flow of the powder by said electrical control.

16. The apparatus of claim 11, further comprising collecting means for collecting the superconductor fine particles in a flow path deflected by said means for applying the magnetic field.

17. The apparatus of claim 11, further comprising first collecting means for collecting the superconductor fine particles in a flow path deflected by said means for applying the magnetic field, and second collecting means for collecting fine particles in another flow path not deflected by said means for applying the magnetic field.

18. The apparatus of claim 11, wherein said carrier medium serves as a coolant for said powder.

19. The apparatus of claim 11, wherein the flow of the powder is formed in either one of a gaseous coolant and a liquid coolant.

20. A purification apparatus for superconductor fine particles, comprising;

- means for floating powder containing the superconductor fine particles by use of a carrier gas to form a flow of the powder along a flow path;
- partition means vertically provided and having a plurality o slits at different heights from said floating means;
- means provided at positions facing said respective slits for applying a magnetic field to the flow of the powder; and an electrical control for controlling said means for applying a magnetic field and said means for forming a flow of powder, wherein the application of the magnetic field is synchronized with the flow of the powder by said electrical control.

21. The apparatus of claim 20, wherein said means for applying a magnetic field comprises an electromagnet.

22. The apparatus of claim 20 further comprising collecting means for collecting the superconductor fine particles in a flow path deflected by said means for applying the magnetic field.

23. The apparatus of claim 20 further comprising first collecting means for collecting the superconductor fine particles in a flow path deflected by said means for applying the magnetic field, and second collecting means for collecting fine particles in another flow path not deflected by said means for applying the magnetic field.

24. The apparatus of claim 23, wherein said first collecting means and said second collecting means are controlled by said electrical control.

25. The apparatus of claim 20, wherein the carrier gas serves as a coolant for said powder.

26. The apparatus of claim 20, wherein the flow of the powder is formed in a coolant.

27. A purification apparatus for superconductor fine particles, comprising;

means for allowing powder containing the superconductor fine particles to fall along a flow path;

partition means horizontally provided in a falling path of the powder and provided with at least one slit at a certain part thereof; and means for alternately applying magnetic fields wit an appropriate period, the magnetic fields having magnetic inclinations in two directions facing each other in a plane perpendicular to the falling direction of the powder.

28. The apparatus of claim 27, wherein said means for applying a magnetic field comprises an electromagnet.

29. The apparatus of claim 27 further comprising collecting means for collecting the superconductor fine particles in a flow path deflected by said means for applying the magnetic field.

30. The apparatus of claim 27, wherein the flow of the powder is formed in a coolant.

31. The apparatus of claim 27, wherein said partition means includes a plurality of partitions disposed in the falling direction of the powder.

32. A purification apparatus for superconductor fine particles, comprising;

means for forming a flow of powder containing the superconductor fine particles along a flow path;

partition means provided in a flow path of the powder and having at least one slit;

means for applying a magnetic field to the flow of the powder; and an electrical control for controlling said means for applying a magnetic field and said means for forming a flow of the powder, wherein the application of the magnetic field is synchronized with the flow of the powder by said electrical control.

33. The apparatus of claim 32, wherein said means for applying a magnetic field comprises an electromagnet.

34. The apparatus of claim 32, wherein said means for applying a magnetic field is provided with a plurality of magnets disposed along the flow path of the powder.

35. The apparatus of claim 32, wherein said means for forming a flow of powder includes means for directly blowing a carrier gas to the powder.

36. The apparatus of claim 35, wherein the carrier gas serves as a coolant for said powder.

37. The apparatus of claim 32, wherein said means for forming a flow of powder allows the powder to fall due to the force of gravity.

38. The apparatus of claim 32 further comprising collecting means for collecting the superconductor fine particles in a flow path deflected by said means for applying the magnetic field.

39. The apparatus of claim 32, wherein the flow of the powder is formed in a coolant.

40. The apparatus of claim 32, wherein said partition means includes a plurality of slits.

41. A purification apparatus for superconductor fine particles, comprising:

means for forming a flow of powder containing the superconductor fine particles along a flow path;

means for forming a plurality of magnetic fields along the flow path of the powder, with the magnetic fields having different magnetic strengths; and an electrical control for controlling said means for forming a plurality of magnetic fields and said means for forming a flow of powder, wherein the formation of the magnetic fields is synchronized with the flow of the powder by said electrical control.

42. The apparatus of claim 41, wherein said means for forming a magnetic field comprises a permanent magnet.

43. The apparatus of claim 41, wherein said means for forming a magnetic field comprises an electromagnet.

44. The apparatus of claim 41, wherein said means for forming a flow of powder includes means for directly blowing a carrier gas to the powder.

45. The apparatus of claim 44, wherein the carrier gas serves as a coolant for said powder.

46. The apparatus of claim 44, wherein said means for forming a flow of powder allows the powder to fall due to the force of gravity.

47. The apparatus of claim 41, further comprising collecting means for collecting the superconductor fine particles in a flow path deflected by said means for forming the magnetic field.

48. The apparatus of claim 41, wherein the flow of the powders is formed in a coolant.

* * * * *

UNITED STATES PATENT AND TRADEMARK OFFICE
CERTIFICATE OF CORRECTION

PATENT NO. : 5,182,253 Page 1 of 2

DATED : January 26, 1993

INVENTOR(S) : Fumio Kishi, et al.

It is certified that error appears in the above-identified patent and that said Letters Patent is hereby corrected as shown below:

On the title page: Item

56] FOREIGN PATENT DOCUMENTS:

Insert: --0320083 6/1989 Euro. Patent--.

OLUMN 3:

Line 11, "3," should read --4,--.

OLUMN 4:

Line 68, "i" should read --in--.

OLUMN 6:

Line 22, "being to all" should read --begin to fall--.

OLUMN 11:

Line 45, "9," should read --8,--.

OLUMN 14:

Line 2, "form" should read --from--.

OLUMN 15:

Line 41, "5ca" should read --5c--.

OLUMN 20:

Line 12, "sued" should read --used,--.
Line 52, "61" should read --71--.

UNITED STATES PATENT AND TRADEMARK OFFICE

CERTIFICATE OF CORRECTION

PATENT NO. : 5,182,253

DATED : January 26, 1993

INVENTOR(S) : Fumio Kishi, et al.

It is certified that error appears in the above-identified patent and that said Letters Patent is hereby corrected as shown below:

COLUMN 21:

Line 51, "mean" should read --means--.

COLUMN 22:

Line 64, "o" should read --of--.

COLUMN 23:

Line 33, "wit" should read --with--.

Signed and Sealed this

Eighth Day of February, 1994

Attest:

BRUCE LEHMAN

Attesting Officer

Commissioner of Patents and Trademarks